(12) United States Patent
Park et al.

(10) Patent No.: US 11,550,087 B2
(45) Date of Patent: Jan. 10, 2023

(54) DISPLAY DEVICE

(71) Applicant: Samsung Display Co., Ltd., Yongin-si (KR)

(72) Inventors: No Kyung Park, Yongin-si (KR); Kyung Bae Kim, Yongin-si (KR); Ji Hye Lee, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 17/237,000

(22) Filed: Apr. 21, 2021

(65) Prior Publication Data

US 2022/0011487 A1 Jan. 13, 2022

(30) Foreign Application Priority Data

Jul. 7, 2020 (KR) .......................... 10-2020-0083754

(51) Int. Cl.
*G02B 5/28* (2006.01)
*G09G 3/32* (2016.01)
*H01L 25/075* (2006.01)

(52) U.S. Cl.
CPC .............. *G02B 5/286* (2013.01); *G09G 3/32* (2013.01); *H01L 25/0753* (2013.01); *G09G 2310/0275* (2013.01)

(58) Field of Classification Search
CPC .. G02B 5/286; G09G 3/32; G09G 2310/0275; G09G 2300/0426; G09G 3/3607; G09G 2380/02; G09G 3/035; G09G 3/3233; H01L 25/0753; H01L 33/18; H01L 27/156; H01L 27/1214; H01L 27/1262; H01L 33/50; G09F 9/33
See application file for complete search history.

(56) References Cited

U.S. PATENT DOCUMENTS

| | | | |
|---|---|---|---|
| 2011/0084268 A1* | 4/2011 | Yamazaki | H01L 27/124 438/151 |
| 2018/0040774 A1* | 2/2018 | Lee | H01L 27/156 |
| 2018/0233089 A1* | 8/2018 | Okamoto | G09G 3/2092 |
| 2019/0096324 A1* | 3/2019 | Soda | G09G 3/3233 |
| 2019/0189876 A1* | 6/2019 | Lee | H01L 33/60 |
| 2020/0013761 A1* | 1/2020 | Chaji | H01L 25/0753 |
| 2020/0013766 A1* | 1/2020 | Kim | H01L 25/167 |
| 2021/0143137 A1 | 5/2021 | Kim et al. | |

FOREIGN PATENT DOCUMENTS

KR 10-2020-0027136 A 3/2020
KR 1020210057891 A 5/2021

* cited by examiner

*Primary Examiner* — Andrew Sasinowski
(74) *Attorney, Agent, or Firm* — Lewis Roca Rothgerber Christie LLP

(57) ABSTRACT

The display device may include a substrate; at least one pixel along a first direction on the substrate and including first, second, and third emission areas, in each of which a plurality of light emitting elements are provided; a light blocking pattern corresponding to an area between the first to third emission areas; and a color filter layer including a first color filter pattern provided on the first emission area, a second color filter pattern provided on the second emission area, and a third color filter pattern provided on the third emission area. Here, the pixel may include a first storage capacitor, a second storage capacitor, and a third storage capacitor on the substrate and corresponding to one of the first to third color filter patterns.

20 Claims, 17 Drawing Sheets

DISPLAY DEVICE

CROSS-REFERENCE TO RELATED APPLICATION

The application claims priority to and the benefit of Korean patent application number 10-2020-0083754 filed on Jul. 7, 2020, the entire content of which is incorporated herein by reference.

BACKGROUND

1. Field

One or more embodiments of the present disclosure relate to a display device.

2. Related Art

With the growing interest in displaying information, and the increasing demand for using a portable information medium, demand (or desire) for display devices increases and commercialization thereof is promoted.

SUMMARY

One or more embodiments of the present disclosure are directed to a display device capable of improving light output efficiency.

One or more embodiments of the present disclosure may provide for a display device. The display device may include a substrate, at least one pixel divided along a first direction on the substrate, the at least one pixel including a first emission area, a second emission area, and a third emission area, each of the first emission area, second emission area, and third emission area including a plurality of light emitting elements, a light blocking pattern corresponding to an area between the first emission area, the second emission area, and the third emission area, and a color filter layer including a first color filter pattern on the first emission area, a second color filter pattern on the second emission area, and a third color filter pattern on the third emission area. The pixel may include a first storage capacitor, a second storage capacitor, and a third storage capacitor on the substrate, the first storage capacitor, the second storage capacitor, and the third storage capacitor corresponding to one of the first color filter pattern, the second color filter pattern, and the third color filter pattern.

In one or more embodiments of the present disclosure, the first color filter pattern may be a red color filter, the second color filter pattern may be a green color filter, and the third color filter pattern may be a blue color filter.

In one or more embodiments of the present disclosure, the display device may further include a buffer layer on the substrate, and a first insulating layer, a second insulating layer, and a third insulating layer sequentially on the buffer layer. Here, each of the first storage capacitor, the second storage capacitor, and the third storage capacitor may include a lower electrode on the first insulating layer and an upper electrode overlapping the lower electrode by being on the second insulating layer.

In one or more embodiments of the present disclosure, the pixel may include a first sub-pixel including the first storage capacitor and at least one transistor electrically connected to the first storage capacitor, a second sub-pixel including the second storage capacitor and at least one transistor electrically connected to the second storage capacitor, and a third sub-pixel including the third storage capacitor and at least one transistor electrically connected to the third storage capacitor.

In one or more embodiments of the present disclosure, a pixel area including the pixel may be divided into a first sub-pixel area including the first sub-pixel, a second sub-pixel area including the second sub-pixel, and a third sub-pixel area including the third sub-pixel, along a second direction that is different from the first direction.

In one or more embodiments of the present disclosure, the first storage capacitor may correspond to the first sub-pixel area, the second storage capacitor may correspond to the second sub-pixel area, and the third storage capacitor may correspond to the third sub-pixel area.

In one or more embodiments of the present disclosure, the pixel may further include a first data line, a second data line, a third data line, and a 1-1-th power line extending in the second direction and provided on the substrate corresponding to the second color filter pattern, and a 2-1-th power line and an initialization power line extending in the second direction and provided on the substrate corresponding to the third color filter pattern.

In one or more embodiments of the present disclosure, the first data line, the second data line, the third data line, the 1-1-th power line, the 2-1-th power line, and the initialization power line may be provided on the buffer layer.

In one or more embodiments of the present disclosure, the pixel may further include a bottom metal layer overlapping each of the first storage capacitor, the second storage capacitor, and the third storage capacitor. Here, the bottom metal layer may be on an identical layer on which the first data line, the second data line, the third data line, the 1-1-th power line, the 2-1-th power line, and the initialization power line are provided.

In one or more embodiments of the present disclosure, the pixel may further include a 1-2-th power line and a 2-2-th power line extending in the first direction and spaced apart from each other on the second insulating layer. Here, the 1-2-th power line may be electrically connected to the 1-1-th power line, and the 2-2-th power line may be electrically connected to the 2-1-th power line.

In one or more embodiments of the present disclosure, the pixel may further include a first electrode, a second electrode, a third electrode, and a fourth electrode on the third insulating layer and located so as to correspond to each of the first emission area, the second emission area, and the third emission area. Here, the first electrode, the second electrode, the third electrode, and the fourth electrode may be spaced apart from each other in the first direction.

In one or more embodiments of the present disclosure, in each of the first emission area, the second emission area, and the third emission area, the first electrode may be electrically connected to the 2-2-th power line. In the first emission area, the third electrode may be electrically connected to the second storage capacitor. In the second emission area, the third electrode may be electrically connected to the third storage capacitor. In the third emission area, the third electrode may be electrically connected to the first storage capacitor.

In one or more embodiments of the present disclosure, the plurality of light emitting elements may include a plurality of first light emitting elements between the first electrode and the second electrode, and electrically connected to the first electrode and the second electrode, and a plurality of second light emitting elements between the third electrode and the fourth electrode, and electrically connected to the third electrode and the fourth electrode.

In one or more embodiments of the present disclosure, the pixel may further include a first contact electrode on the first electrode to electrically connect the first electrode to a first end of each of the plurality of first light emitting elements, an intermediate electrode on the respective second and fourth electrodes to electrically connect a second end of each of the plurality of first light emitting elements to a first end of each of the plurality of second light emitting elements, and a second contact electrode on the third electrode to electrically connect the third electrode to a second end of each of the plurality of second light emitting elements.

In one or more embodiments of the present disclosure, the first contact electrode, the intermediate electrode, and the second contact electrode may be spaced apart from each other.

In one or more embodiments of the present disclosure, the plurality of second light emitting elements may be coupled in parallel to each other between the third electrode and the fourth electrode to form a first serial set, and the plurality of first light emitting elements may be coupled in parallel to each other between the first electrode and the second electrode to form a second serial set. Here, the third electrode may be an anode electrode, and the first electrode may be a cathode electrode.

In one or more embodiments of the present disclosure, the pixel may further include a bank including a first open hole corresponding to the first emission area, a first open hole of the bank corresponding to the second emission area, a first open hole of the bank corresponding to the third emission area, a second open hole, and a third open hole spaced apart from the first open hole. Here, the light blocking pattern may be on the bank.

In one or more embodiments of the present disclosure, the first open hole of the bank corresponding to the first emission area, the first open hole of the bank corresponding to the second emission area, and the first open hole of the bank corresponding to the third emission area may have identical sizes.

In one or more embodiments of the present disclosure, the light blocking pattern may include a first opening corresponding to the first color filter pattern, a second opening corresponding to the second color filter pattern, and a third opening corresponding to the third color filter pattern. Here, the size of the first opening may be different from a size of the second opening and a size of the third opening.

In one or more embodiments of the present disclosure, the size of the first opening may be greater than the size of each of the second opening and the third opening. Also, the size of the first color filter pattern may be greater than the size of the second color filter pattern and a size of the third color filter pattern.

In one or more embodiments of the present disclosure, the display device may further include a color conversion layer between the pixel and the color filter layer.

In one or more embodiments of the present disclosure, the color conversion layer may include a first color conversion layer corresponding to the first color filter pattern to convert light emitted from the plurality of light emitting elements to a first color of light, a second color conversion layer corresponding to the second color filter pattern to convert light emitted from the plurality of light emitting elements to a second color of light, and a third color conversion layer corresponding to the third color filter pattern to convert light emitted from the plurality of light emitting elements to a third color of light or to transmit the emitted light without change.

BRIEF DESCRIPTION OF THE DRAWINGS

The accompanying drawings, together with the specification, illustrate embodiments of the subject matter of the present disclosure, and, together with the description, serve to explain principles of embodiments of the subject matter of the present disclosure.

FIG. 3 is a schematic plan diagram of a display device in which the light emitting element illustrated in FIG. 1 and FIG. 2 is used as a light source.

DETAILED DESCRIPTION

Figure 1:
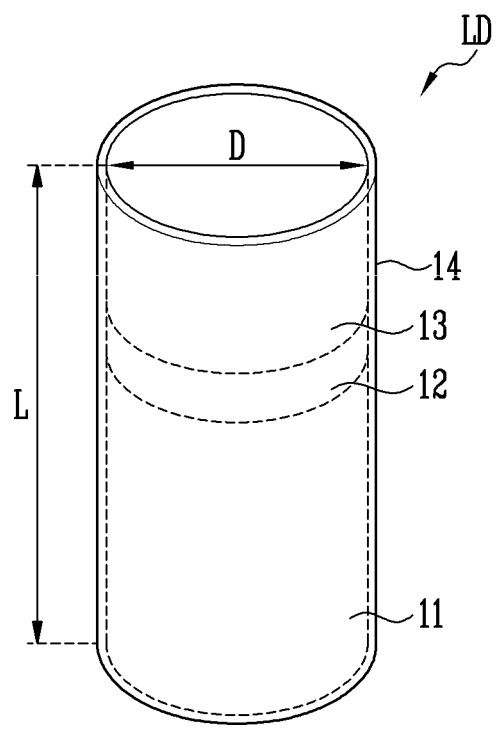
FIG. 1 is a perspective view schematically illustrating a light emitting element according to one or more embodiments of the present disclosure.

As the present disclosure allows for various changes and numerous embodiments, particular embodiments will be illustrated in the drawings and described in more detail in the written description. However, this is not intended to limit the present disclosure to particular modes of practice, and it is to be appreciated that all changes, equivalents, and substitutes that do not depart from the spirit and technical scope of the present disclosure are encompassed in the present disclosure.

Throughout the disclosure, like reference numerals refer to like parts throughout the various figures and embodiments of the present disclosure. The sizes of elements in the accompanying drawings may be exaggerated for clarity of illustration. It will be understood that, although the terms "first," "second," etc. may be used herein to describe various elements, these elements should not be limited by these terms. These terms are only used to distinguish one element from another element. For instance, a first element discussed below could be termed a second element without departing from the spirit and scope of the present disclosure. Similarly, the second element could also be termed a first element. In the present disclosure, the singular forms are intended to include the plural forms as well, unless the context clearly indicates otherwise.

It will be further understood that the terms "comprise," "include," "have," etc. when used in this specification, specify the presence of stated features, integers, steps, operations, elements, components, and/or combinations of them but do not preclude the presence or addition of one or more other features, integers, steps, operations, elements, components, and/or combinations thereof. Furthermore, when a first part such as a layer, a film, a region, or a plate is on a second part, the first part may be not only directly on the second part (without any intervening parts therebetween), but a third part may intervene between them. In addition, when it is expressed that a first part such as a layer, a film, a region, or a plate is formed on a second part, the surface of the second part on which the first part is formed is not limited to an upper surface of the second part, but may include other surfaces such as a side surface or a lower surface of the second part. When a first part such as a layer, a film, a region, or a plate is under a second part, the first part may be not only directly under the second part (without any intervening parts therebetween), but a third part may intervene between them.

In the present specification, when it is expressed that a first component is operatively or communicatively coupled with/to a second component or connected thereto, the first component should be understood as being directly coupled to the second component or as being coupled thereto via a third component. To the contrary, when it is expressed that a first component is directly coupled with/to a second component or directly connected thereto, it may be understood that there is no intervening component therebetween.

The term "and/or" includes one or more combinations which may be defined by relevant elements. Expressions such as "at least one of," "one of," and "selected from," when preceding a list of elements, modify the entire list of elements and do not modify the individual elements of the list. Further, the use of "may" when describing embodiments of the present disclosure refers to "one or more embodiments of the present disclosure."

As used herein, the terms "use," "using," and "used" may be considered synonymous with the terms "utilize," "utilizing," and "utilized," respectively.

In addition, the terms "substantially," "about," and similar terms are used as terms of approximation and not as terms of degree, and are intended to account for the inherent deviations in measured or calculated values that would be recognized by those of ordinary skill in the art.

Also, any numerical range recited herein is intended to include all subranges of the same numerical precision subsumed within the recited range. For example, a range of "1.0 to 10.0" is intended to include all subranges between (and including) the recited minimum value of 1.0 and the recited maximum value of 10.0, that is, having a minimum value equal to or greater than 1.0 and a maximum value equal to or less than 10.0, such as, for example, 2.4 to 7.6. Any maximum numerical limitation recited herein is intended to include all lower numerical limitations subsumed therein and any minimum numerical limitation recited in this specification is intended to include all higher numerical limitations subsumed therein. Accordingly, Applicant reserves the right to amend this specification, including the claims, to expressly recite any sub-range subsumed within the ranges expressly recited herein.

Hereinafter, example embodiments of the present disclosure and other matters needed for those skilled in the art to readily understand the content of the present disclosure will be described in more detail with reference to the accompanying drawings.

Figure 2:
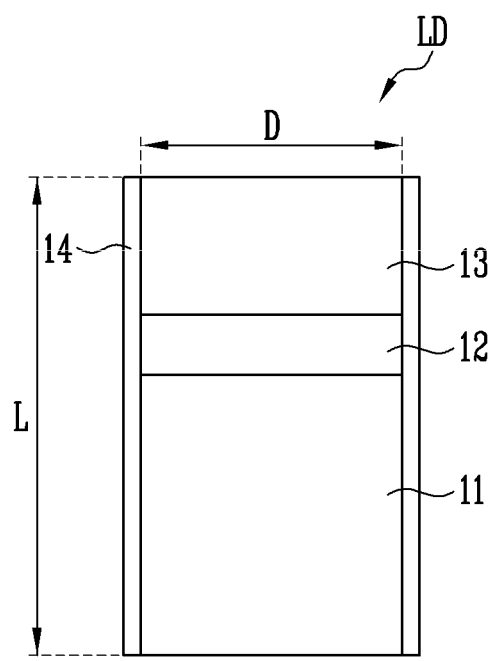
FIG. 2 is a cross-sectional diagram of the light emitting element of FIG. 1.

FIG. 1 is a perspective view schematically illustrating a light emitting element according to one or more embodiments of the present disclosure, and FIG. 2 is a cross-sectional diagram of the light emitting element of FIG. 1.

In one or more embodiments of the present disclosure, the type (e.g., kind) and/or shape of a light emitting element are (is) not limited to the embodiment illustrated in FIG. 1 and FIG. 2.

Referring to FIG. 1 and FIG. 2, the light emitting element LD may include a first semiconductor layer 11, a second semiconductor layer 13, and an active layer 12 interposed therebetween. For example, the light emitting element LD may be implemented as a light emitting stacked body in which the first semiconductor layer 11, the active layer 12, and the second semiconductor layer 13 are sequentially stacked.

The light emitting element LD may be provided in a shape extending in one direction. If the direction in which the light emitting element LD extends is a longitudinal direction, the light emitting element LD may include a first end (or a lower end) and a second end (or an upper end) along the extension direction. Any one of the first and second semiconductor layers 11 and 13 may be on the first end (or the lower end) of the light emitting element LD, and the other one of the first and second semiconductor layers 11 and 13 may be on the second end (or the upper end) of the light emitting element LD. For example, the first semiconductor layer 11 may be on the first end (or the lower end) of the light emitting element LD, and the second semiconductor layer 13 may be on the second end (or the upper end) of the light emitting element LD.

The light emitting element LD may be provided in any of various suitable shapes. For example, the light emitting element LD may have a rod-like shape or a bar-like shape extending in the longitudinal direction (for example, to have an aspect ratio greater than 1). In one or more embodiments of the present disclosure, the length L of the light emitting element LD in the longitudinal direction may be greater than the diameter D (or the width of the transverse cross-section) thereof. Such light emitting element LD may include a light emitting diode (LED) fabricated in a subminiature size, having a diameter D and/or length L corresponding to, e.g., a microscale to a nanoscale size.

The diameter D of the light emitting element LD may be in a range from 0.5 μm to 500 μm, and the length L thereof may be in a range from 1 μm to 10 μm. However, the diameter D and the length L of the light emitting element LD are not limited thereto, and the size of the light emitting element LD may be suitably changed so as to meet the requirements (or design requirements) of a lighting device or a self-emissive display device in which the light emitting element LD is applied.

The first semiconductor layer 11 may include, for example, at least one n-type semiconductor layer. For example, the first semiconductor layer 11 may include any of semiconductor materials, such as InAlGaN, GaN, AlGaN, InGaN, AlN, and/or InN, and may be an n-type semiconductor layer doped with a first conductive dopant (or an n-type dopant), such as Si, Ge, Sn, and/or the like. However, the material forming the first semiconductor layer 11 is not limited thereto, and various other suitable materials may form the first semiconductor layer 11. In one or more embodiments of the present disclosure, the first semiconductor layer 11 may include a gallium nitride (GaN) semiconductor material doped with a first conductive dopant (or an n-type dopant). The first semiconductor layer 11 may include an upper surface coming into contact (e.g., physical contact) with the active layer 12 and a lower surface exposed outside along the direction of the length L of the light emitting element LD. The lower surface of the first semiconductor layer 11 may be the first end (or the lower end) of the light emitting element LD.

The active layer 12 may be on the first semiconductor layer 11, and may be formed so as to have a single- or multi-quantum-well structure. For example, when the active layer 12 is formed so as to have a multi-quantum-well structure, the active layer 12 may be formed by periodically and repeatedly stacking a barrier layer, a strain reinforcing layer, and a well layer as a single unit. Because the strain reinforcing layer has a smaller lattice constant than the barrier layer, it may reinforce the strain (e.g., the compressive strain) applied to the well layer. However, the structure of the active layer 12 is not limited to the above-described embodiment.

The active layer 12 may emit light having a wavelength in a range of 400 nm to 900 nm, and may use a double-hetero structure. In one or more embodiments of the present disclosure, a clad layer doped with a conductive dopant may be optionally formed on and/or under the active layer 12 along the direction of the length L of the light emitting element LD. For example, the clad layer may be formed as an AlGaN layer and/or an InAlGaN layer. According to one or more embodiments, materials such as AlGaN, InAlGaN, and/or the like may be used to form the active layer 12, and various other suitable materials may form the active layer 12. The active layer 12 may include a first surface coming into contact (e.g., physical contact) with the first semiconductor layer 11 and a second surface coming into contact (e.g., physical contact) with the second semiconductor layer 13.

When an electric field of a predetermined (or set) voltage or more is applied to the opposite ends of the light emitting element LD, electron-hole pairs are combined in the active layer 12, whereby the light emitting element LD emits light. Emission of the light emitting element LD is controlled using this principle, whereby the light emitting element LD may be used as the light source (or the light emitting source) of various suitable light emitting devices, such as pixels of a display device and/or the like.

The second semiconductor layer 13 may be on the second surface of the active layer 12, and may include a semiconductor layer having a type (or kind) different from that of the first semiconductor layer 11. For example the second semiconductor layer 13 may include at least one p-type semiconductor layer. For example, the second semiconductor layer 13 may include at least one semiconductor material among InAlGaN, GaN, AlGaN, InGaN, AlN, and InN, and may include a p-type semiconductor layer doped with a second conductive dopant (or a p-type dopant), such as Mg and/or the like. However, the material forming the second semiconductor layer 13 is not limited thereto, and various other suitable materials may form the second semiconductor layer 13. In one or more embodiments of the present disclosure, the second semiconductor layer 13 may include a gallium nitride (GaN) semiconductor material doped with a second conductive dopant (or a p-type dopant). The second semiconductor layer 13 may include a lower surface coming into contact (e.g., physical contact) with the second surface of the active layer 12, and an upper surface exposed outside along the direction of the length L of the light emitting element LD. Here, the upper surface of the second semiconductor layer 13 may be the second end (or the upper end) of the light emitting element LD.

In one or more embodiments of the present disclosure, the first semiconductor layer 11 and the second semiconductor layer 13 may have different thicknesses in the direction of the length L of the light emitting element LD. For example, along the direction of the length L of the light emitting element LD, the first semiconductor layer 11 may have a thickness relatively greater than the thickness of the second semiconductor layer 13. Accordingly, the active layer 12 of the light emitting element LD may be located closer to the upper surface of the second semiconductor layer 13 than to the lower surface of the first semiconductor layer 11.

Although each of the first semiconductor layer 11 and the second semiconductor layer 13 is illustrated as including a single layer, the present disclosure is not limited thereto. In one or more embodiments of the present disclosure, each of the first semiconductor layer 11 and the second semiconductor layer 13 may further include one or more layers (e.g., a clad layer and/or a tensile strain barrier reducing (TSBR) layer), depending on the material of the active layer 12. The TSBR layer may be a strain relaxation layer that acts as a buffer for decreasing a lattice constant difference by being between semiconductor layers having different lattice structures. The TSBR layer may be formed of a p-type semiconductor layer, such as p-GaInP, p-AlInP, p-AlGaInP, and/or the like, but the present disclosure is not limited thereto.

According to one or more embodiments, the light emitting element LD may further include an additional electrode (hereinbelow referred to as a 'first additional electrode') on the second semiconductor layer 13, in addition to the first semiconductor layer 11, the active layer 12, and the second semiconductor layer 13 described above. Also, according to one or more embodiments, the light emitting element LD may further include another additional electrode (hereinbelow referred to as a 'second additional electrode') on the first end of the first semiconductor layer 11.

In one or more embodiments, each of the first and second additional electrodes may be an ohmic contact electrode, but the present disclosure is not limited thereto. According to one or more embodiments, the first and second additional electrodes may be Schottky contact electrodes. The first and second additional electrodes may include conductive materials (or substance). For example, the first and second additional electrodes may include opaque metal, which uses one of chromium (Cr), titanium (Ti), aluminum (Al), gold (Au), nickel (Ni), and an oxide or alloy thereof alone, or uses a combination thereof, but the present disclosure is not limited thereto. According to one or more embodiments, the first and second additional electrodes may include a transparent conductive oxide, such as indium tin oxide (ITO), indium zinc oxide (IZO), zinc oxide (ZnO), indium gallium zinc oxide (IGZO), and/or indium tin zinc oxide (ITZO).

Materials included in the first and second additional electrodes may be the same as or different from each other. The first and second additional electrodes may be substantially transparent or semitransparent. Accordingly, light generated in the light emitting element LD passes through each of the first and second additional electrodes, thereby being emitted outside the light emitting element LD. According to one or more embodiments, when light generated in the light emitting element LD is emitted outside the light emitting element LD through an area excluding the opposite ends of the light emitting element LD, without passing through the first and second additional electrodes, the first and second additional electrodes may include opaque metal.

In one or more embodiments of the present disclosure, the light emitting element LD may further include an insulating layer 14. However, according to one or more embodiments, the insulating layer 14 may be omitted, or may be provided so as to cover only some of the first semiconductor layer 11, the active layer 12, and the second semiconductor layer 13.

The insulating layer 14 may prevent or reduce a short-circuit that can otherwise be caused when the active layer 12 comes into contact (e.g., physical contact) with a conductive material, other than the first and second semiconductor layers 11 and 13. Also, the insulating layer 14 minimizes or reduces occurrence of a defect on the surface of the light emitting element LD, thereby improving the lifetime and light output efficiency of the light emitting element LD. Also, when a plurality of light emitting elements LD are close to each other, the insulating layer 14 may prevent or reduce an undesired short-circuit that can otherwise occur between the light emitting elements LD. If the active layer 12 includes an external conductive material that is able to prevent or reduce short-circuiting, the insulating layer 14 is optional (e.g., the insulating layer 14 may be omitted).

The insulating layer 14 may be provided to entirely enclose the outer peripheral surface (e.g., the outer circumference surface) of the light emitting stacked body that includes the first semiconductor layer 11, the active layer 12, and the second semiconductor layer 13.

In the above-descried embodiment, the insulating layer 14 has been described as having a shape entirely enclosing the outer peripheral surface (e.g., the outer circumference surface) of each of the first semiconductor layer 11, the active layer 12, and the second semiconductor layer 13, but the present disclosure is not limited thereto. According to one or more embodiments, when the light emitting element LD includes the first additional electrode, the insulating layer 14 may entirely enclose the outer peripheral surface (e.g., the outer circumference surface) of each of the first semiconductor layer 11, the active layer 12, the second semiconductor layer 13, and the first additional electrode. According to one or more embodiments, the insulating layer 14 may not enclose the outer peripheral surface (e.g., the outer circumference surface) of the first additional electrode, or may enclose only a portion of the outer peripheral surface (e.g., the outer circumference surface) of the first additional electrode, without enclosing the remaining portion thereof. Also, according to one or more embodiments, when the first additional electrode is on the second end (or the upper end) of the light emitting element LD and when the second additional electrode is on the first end (or the lower end) of the light emitting element LD, the insulating layer 14 may allow at least a portion of each of the first and second additional electrodes to be exposed.

The insulating layer 14 may include a transparent insulating material. For example, the insulating layer 14 may include one or more insulating materials selected from a group comprising silicon oxide ($SiO_x$), silicon nitride ($SiN_x$), silicon oxynitride ($SiO_xN_y$), aluminum oxide ($AlO_x$), titanium dioxide ($TiO_2$), and the like. However, the present disclosure is not limited thereto, and various suitable materials having an insulating property may be used as the material of the insulating layer 14. The insulating layer 14 may be provided in the form of a single-film or in the form of a multi-film including at least two films.

According to one or more embodiments, the light emitting element LD may be implemented as a light emitting pattern having a core-shell structure. In this case, the above-described first semiconductor layer 11 may be located at the core of the light emitting element LD, for example, at the center thereof, the active layer 12 may be provided and/or formed in a shape enclosing the outer peripheral surface (e.g., the outer circumference surface) of the first semiconductor layer 11, and the second semiconductor layer 13 may be provided and/or formed in a shape enclosing the active layer 12. In one or more embodiments, the light emitting element LD may further include an additional electrode enclosing at least one side of the second semiconductor layer 13. According to one or more embodiments, the light emitting element LD may further include an insulating layer 14 including a transparent insulating material and provided on the outer peripheral surface (e.g., the outer circumference surface) of the light emitting pattern having a core-shell structure. The light emitting element LD implemented as the light emitting pattern having a core-shell structure may be fabricated using a growth method.

The above-described light emitting element LD may be used as the light emitting source of various suitable display devices. The light emitting element LD may be fabricated through a surface treatment process. For example, when a plurality of light emitting elements LD are mixed with a liquid solution (or a solvent) and supplied to each pixel area (e.g., the emission area of each pixel or the emission area of each sub-pixel), the surface treatment may be performed on each of the light emitting elements LD such that the light emitting elements LD are substantially uniformly sprayed (or distributed), rather than unevenly agglomerated in the solution.

A light emitting unit (or a light emitting device) including the above-described light emitting element LD may be used in various suitable kinds of electronic devices that require a light source, such as a display device and/or the like. For example, when a plurality of light emitting elements LD are in the pixel area of each pixel of a display panel, the light emitting elements LD may be used as the light source of the pixel. However, the application field of the light emitting element LD is not limited to the above-described example. For example, the light emitting element LD may also be used in other types (or kinds) of electronic devices requiring a light source, such as a lighting device and/or the like.

Figure 3:
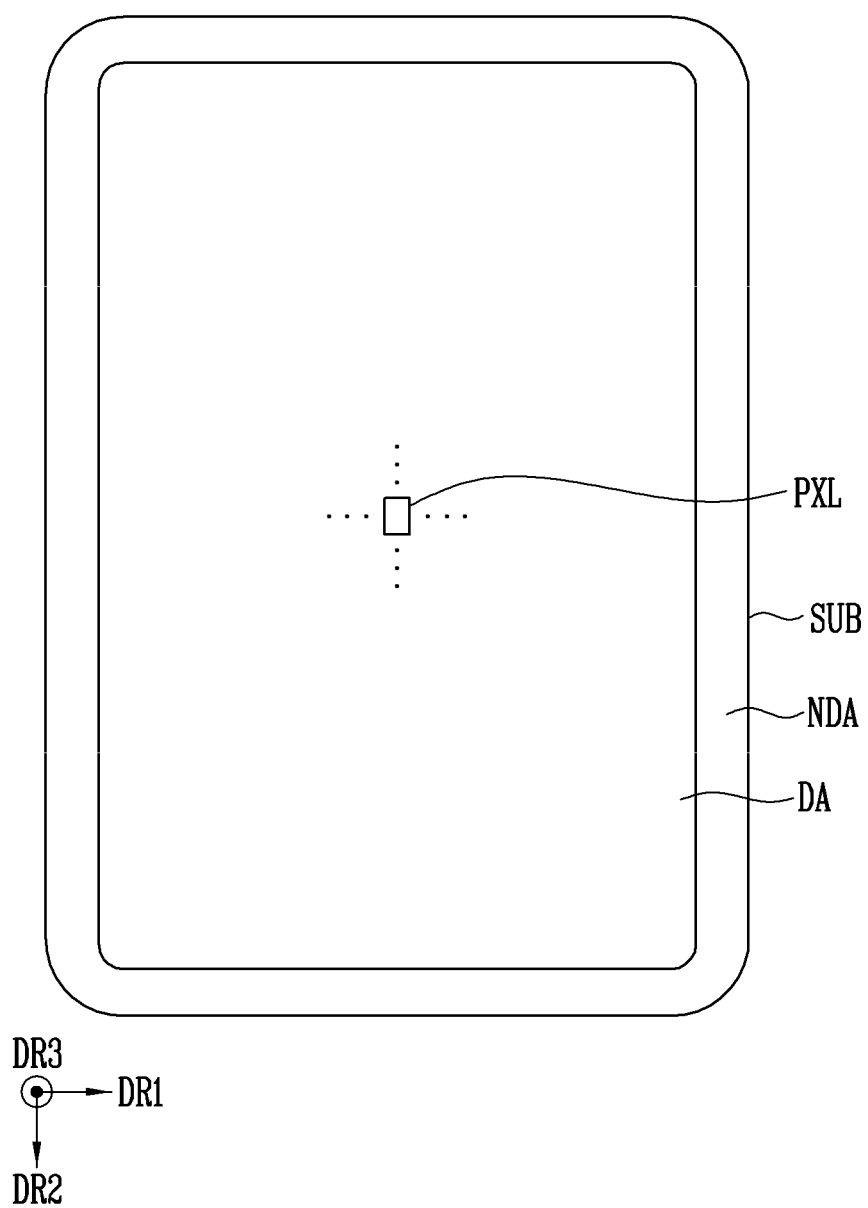
FIG. 3 illustrates a display device according to one or more embodiments of the present disclosure, and particularly.

FIG. 3 illustrates a display device according to one or more embodiments of the present disclosure, and particularly, FIG. 3 is a schematic plan diagram of a display device in which the light emitting element illustrated in FIG. 1 and FIG. 2 is used as a light source.

In FIG. 3, the structure of the display device is briefly illustrated with focus on a display area DA, in which an image is displayed, for the convenience.

Referring to FIGS. 1 to 3, the display device according to one or more embodiments of the present disclosure may include a substrate SUB, a plurality of pixels PXL provided on the substrate SUB and each including at least one light emitting element LD, a driver provided on the substrate SUB and configured to drive the pixels PXL, and a line component configured to couple the pixels PXL to the driver.

When the display device is an electronic device in which a display surface is applied to at least one surface thereof, such as a smartphone, a television, a tablet PC, a mobile phone, a video phone, an e-book reader, a desktop PC, a laptop PC, a netbook computer, a workstation, a server, a PDA, a portable multimedia player (PMP), an MP3 player, a medical device, a camera, a wearable device, and/or the like, the present disclosure may be applied thereto.

The display device may be classified into a passive-matrix-type (or kind) display device and an active-matrix-type (or kind) display device, depending on a method of driving a light emitting element LD. For example, when the display device is implemented as an active matrix type (or kind), each of the pixels PXL may include a driving transistor configured to control the amount of current supplied to the light emitting element LD, a switching transistor configured to transmit a data signal to the driving transistor, and the like.

The display device may be provided in any of various suitable shapes. For example, the display device may be provided in a rectangular plate shape having two pairs of parallel sides, but the present disclosure is not limited thereto. When the display device is provided in a rectangular plate shape, any one pair of sides may be provided so as to be longer than the other pair of sides. For the convenience, the case in which the display device has a rectangular shape having a pair of long sides and a pair of short sides is illustrated. Also, the direction in which the long sides extend is represented as a second direction DR2, the direction in which the short sides extend is represented as a first direction DR1, and the direction perpendicular to the directions in which the long sides extend and in which the short sides extend is represented as a third direction DR3. In the display device provided in a rectangular plate shape, a corner, at which a single long side and a single short side are in contact (e.g., physical contact) with each other (or meet each other), may have a round (or rounded) shape.

The substrate SUB may include a display area DA and a non-display area NDA.

The display area DA may be an area in which the pixels PXL configured to display an image are provided. The non-display area NDA may be an area in which the driver for driving the pixels PXL, and a portion of the line component configured to connect the pixels PXL, to the driver are provided. For the convenience, only a single pixel PXL is illustrated in FIG. 3, but a plurality of pixels PXL may be provided in the display area DA of the substrate SUB.

The non-display area NDA may be provided on at least one side of the display area DA. The non-display area NDA may enclose the periphery (or edge) of the display area DA. In the non-display area NDA, the line component connected to the pixels PXL, and the driver connected to the line component and configured to drive the pixels PXL, may be provided.

The line component may electrically connect the driver to the pixels PXL. The line component may be signal lines connected to each of the pixels PXL and configured to provide a signal to the pixel PXL, and may be, for example, a fan-out line connected to a scan line, a data line, an emission control line, and/or the like. In one or more embodiments, the line component may be signal lines connected to each of the pixels PXL in order to compensate for a change in the electrical characteristics of the pixel PXL in real time, and may be, for example, a fan-out line connected to a control line, a sensing line, and/or the like.

The substrate SUB may transmit light by including a transparent insulating material. The substrate SUB may be a rigid substrate or a flexible substrate.

An area on the substrate SUB may be provided as the display area DA, such that the pixels PXL are disposed therein, and the remaining area on the substrate SUB may be provided as the non-display area NDA. For example, the substrate SUB may include the display area DA including pixel areas, in which the respective pixels PXL are disposed, and a non-display area NDA around the display area DA (or adjacent to the display area DA).

Each of the pixels PXL may be provided inside the display area DA on the substrate SUB. In one or more embodiments of the present disclosure, the pixels PXL may be arranged in the display area DA so as to have a stripe arrangement structure or a PenTile®/PENTILE® arrangement structure or pattern (PENTILE® is a registered trademark owned by Samsung Display Co., Ltd.), but the present disclosure is not limited thereto.

Each pixel PXL may include at least one light emitting element LD that is driven in response to a scan signal and a data signal corresponding thereto. The light emitting element LD may have a small size ranging from a nanoscale to a microscale, and may be coupled in parallel to the light emitting elements adjacent thereto, but the present disclosure is not limited thereto. The light emitting element LD may configure the light source of each pixel PXL.

Each pixel PXL may include at least one light source (e.g., the light emitting element LD illustrated in FIG. 1) that is driven in response to predetermined (or set) signals (e.g., a scan signal and a data signal) and/or predetermined (or set) power (e.g., first driving power and second driving power). However, in one or more embodiments of the present disclosure, the light emitting element LD that can be used as the light source of each pixel PXL is not limited thereto.

The driver provides predetermined (or set) signals and predetermined (or set) power to each pixel PXL through the line component, thereby controlling driving of the pixel PXL. The driver may include a scan driver, an emission driver, a data driver, and a timing controller.

Figure 4:
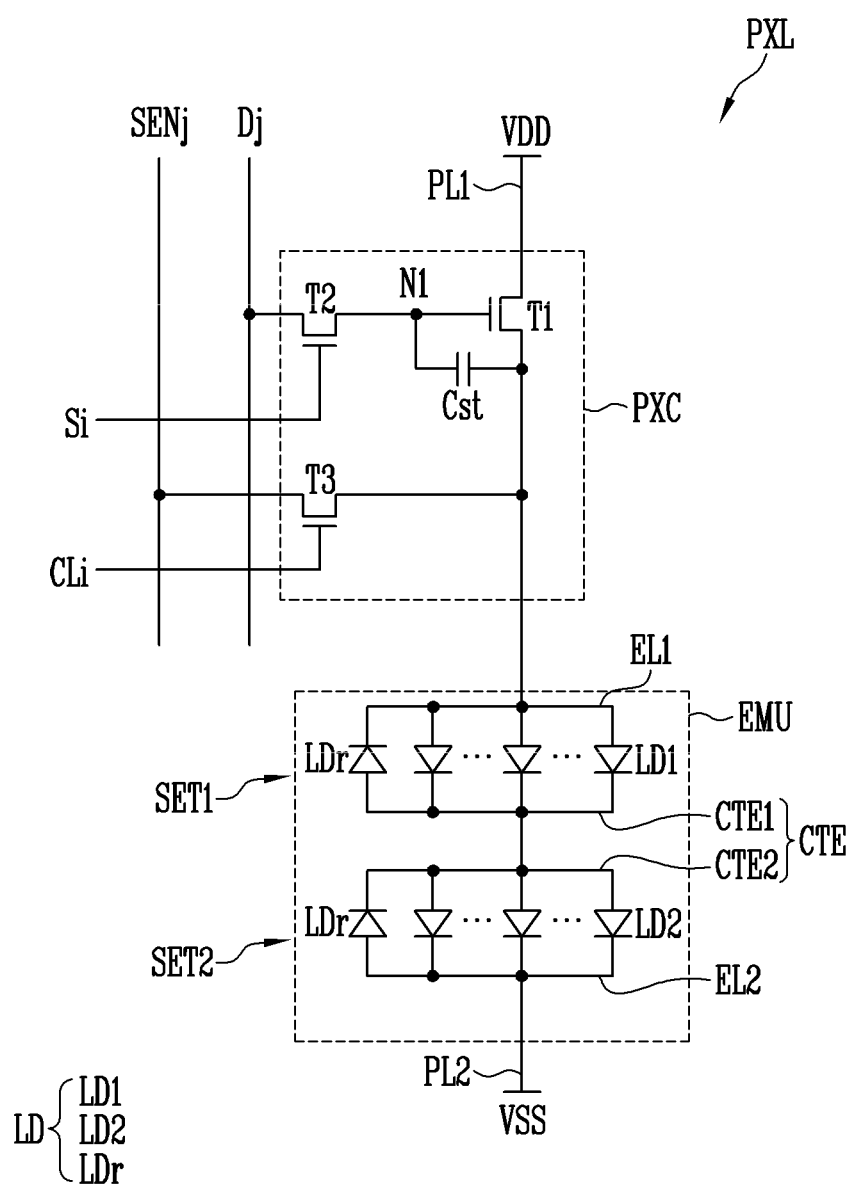
FIG. 4 is a circuit diagram illustrating the electrical connection relationship between components included in the pixel illustrated in FIG. 3 according to one or more embodiments.

FIG. 4 is a circuit diagram illustrating the electrical connection relationship between components included in the pixel illustrated in FIG. 3 according to one or more embodiments.

For example, FIG. 4 illustrates the electrical connection relationship between components included in a pixel PXL capable of being applied to an active-type (or kind) display device according to one or more embodiments. However, the components included in the pixel PXL to which one or more embodiments of the present disclosure is capable of being applied are not limited thereto.

In FIG. 4, a part including not only the components included in each of the pixels illustrated in FIG. 3, but also the area in which the components are provided, is referred to as a pixel PXL.

Referring to FIGS. 1 to 4, a single pixel (hereinbelow referred to as a 'pixel') PXL may include a light emitting unit EMU configured to generate light with luminance corresponding to a data signal. Also, the pixel PXL may optionally further include a pixel circuit PXC for driving the light emitting unit EMU.

The pixel circuit PXC may be connected to the scan line Si and the data line Dj of the corresponding pixel PXL. For example, when the pixel PXL is in the i-th row (i being a natural number) and the j-th column (j being a natural number) of the display area DA, the pixel circuit PXC of the pixel PXL may be connected to the i-th scan line Si and the j-th data line Dj of the display area DA. Also, the pixel circuit PXC may be connected to the i-th control line CLi and the j-th sensing line SENj of the display area DA.

The above-described pixel circuit PXC may include first to third transistors T1 to T3 and a storage capacitor Cst.

The first terminal of the second transistor (the switching transistor) T2 may be connected to the j-th data line Dj, and the second terminal thereof may be connected to a first node N1. Here, the first terminal and the second terminal of the second transistor T2 are terminals different from each other, and for example, when the first terminal is a drain electrode, the second terminal may be a source electrode. Also, the gate electrode of the second transistor T2 may be connected to the i-th scan line Si.

The second transistor T2 is turned on when a scan signal of a voltage capable of turning on the second transistor T2 is supplied from the i-th scan line Si, thereby electrically coupling the j-th data line Dj to the first node N1. Here, the data signal of a corresponding frame is supplied to the j-th data line Dj, whereby the data signal is transmitted to the first node N1. The storage capacitor Cst is charged with the data signal transmitted to the first node N1.

The first terminal of the first transistor (the driving transistor) T1 may be connected to a first driving power supply VDD, and the second terminal thereof may be electrically connected to the first electrode EL1 of each of the light emitting elements LD. The gate electrode of the first transistor T1 may be connected to the first node N1. The first transistor T1 may control the amount of driving current supplied to the light emitting elements LD in response to the voltage of the first node N1.

The third transistor T3 may be connected between the first transistor T1 and the j-th sensing line SENj. For example, the first terminal of the third transistor T3 may be connected to the second terminal of the first transistor T1, which is connected to the first electrode EL1, and the second terminal of the third transistor T3 may be connected to the j-th sensing line SENj. The gate electrode of the third transistor T3 may be connected to the i-th control line CLi. The third transistor T3 is turned on in response to a control signal of a gate-on voltage supplied to the i-th control line CLi during a predetermined sensing period, thereby electrically coupling the j-th sensing line SENj to the first transistor T1.

The sensing period may be a period in which the characteristic information of each of the pixels PXL in the display area DA (e.g., the threshold voltage of the first transistor T1, and the like) is extracted.

The first electrode of the storage capacitor Cst may be connected to the first driving power supply VDD, and the second electrode thereof may be connected to the first node N1. The storage capacitor Cst is charged with a voltage corresponding to the data signal supplied to the first node N1, and may maintain the voltage until the data signal of the next frame is supplied.

The light emitting unit EMU may include a plurality of light emitting elements LD coupled in parallel to each other between a first power line PL1, through which the voltage of the first driving power supply VDD is applied, and a second power line PL2, through which the voltage of a second driving power supply VSS is applied. For example, the light emitting unit EMU may include a first electrode (or a "first alignment electrode") EL1, connected to the first driving power supply VDD via the pixel circuit PXC and the first power line PL1, a second electrode (or a "second alignment electrode") EL2, connected to the second driving power supply VSS through the second power line PL2, and a plurality of light emitting elements LD coupled in parallel to each other in the same direction between the first and second electrodes EL1 and EL2.

Each of the light emitting elements LD included in the light emitting unit EMU may include a first end connected to the first driving power supply VDD through the first electrode EL1 and a second end connected to the second driving power supply VSS through the second electrode EL2. The first driving power supply VDD and the second driving power supply VSS may have potentials different from each other. For example, the first driving power supply VDD may be set as a high-potential power supply, and the second driving power supply VSS may be set as a low-potential power supply. Here, the potential difference between the first and second driving power supplies VDD and VSS may be set equal to or higher than the threshold voltage of the light emitting elements LD during the emission period of the pixel PXL.

As described above, the respective light emitting elements LD coupled in parallel to each other in the same direction (e.g., the forward direction) between the first electrode EL1 and the second electrode EL2, to which voltages of different potentials are respectively supplied, may configure respective effective (or forward biased) light sources. These effective (or forward biased) light sources are collected, thereby configuring the light emitting unit EMU of the pixel PXL.

The light emitting elements LD of the light emitting unit EMU may emit light with luminance corresponding to the driving current supplied through the corresponding pixel circuit PXC. For example, during each frame period, the pixel circuit PXC may supply driving current, corresponding to the grayscale value of the data of the corresponding frame, to the light emitting unit EMU. The driving current supplied to the light emitting unit EMU may be divided so as to flow in the respective light emitting elements LD. Accordingly, the respective light emitting elements LD emit light with luminance corresponding to the current flowing therein, whereby the light emitting unit EMU may emit light with luminance corresponding to the driving current.

According to one or more embodiments, the light emitting unit EMU may further include at least one ineffective light source (e.g., a reverse or reverse biased light emitting element LDr) in addition to the light emitting elements LD configuring the respective effective (or forward biased) light sources. This reverse light emitting element LDr is coupled in parallel along with the light emitting elements LD configuring the effective (e.g., forward biased) light sources between the first and second electrodes EL1 and EL2, but may be coupled in a reverse direction relative to the light emitting elements LD between the first and second electrodes EL1 and EL2. The reverse light emitting element LDr maintains a disabled state even though a predetermined (or set) driving voltage (e.g., a forward driving voltage) is applied between the first and second electrodes EL1 and EL2, and current may not substantially flow in the reverse light emitting element LDr.

Each light emitting unit EMU may be configured to include at least one serial set including a plurality of light emitting elements LD coupled in parallel to each other. For example, the light emitting unit EMU may be formed so as to have a series/parallel hybrid structure, as illustrated in FIG. 4.

The light emitting unit EMU may include first and second serial sets SET1 and SET2 that are sequentially connected between the first and second driving power supplies VDD and VSS. The first and second serial sets SET1 and SET2 may respectively include two electrodes EL1 and CTE1, and CTE2 and EL2, configuring a pair of electrodes of the corresponding serial set, and a plurality of light emitting elements LD coupled in parallel to each other in the same direction between the two electrodes EL1 and CTE1, and CTE2 and EL2, respectively.

The first serial set SET1 may include the first electrode EL1 and the first intermediate electrode CTE1, and may include at least one first light emitting element LD1 connected between the first electrode EL1 and the first intermediate electrode CTE1. Also, the first serial set SET1 may include a reverse light emitting element LDr coupled in a reverse direction relative to the first light emitting element LD1 between the first electrode EL1 and the first intermediate electrode CTE1.

The second serial set SET2 may include the second intermediate electrode CTE2 and the second electrode EL2, and may include at least one second light emitting element LD2 connected between the second intermediate electrode CTE2 and the second electrode EL2. Also, the second serial set SET2 may include a reverse light emitting element LDr coupled in a reverse direction relative to the second light emitting element LD2 between the second intermediate electrode CTE2 and the second electrode EL2.

The first intermediate electrode CTE1 of the first serial set SET1 and the second intermediate electrode CTE2 of the second serial set SET2 are provided as a single body, thereby being connected to each other. For example, the first intermediate electrode CTE1 and the second intermediate electrode CTE2 may form an intermediate electrode CTE that electrically connects the consecutive first serial set SET1 and second serial set SET2 to each other. When the first intermediate electrode CTE1 and the second intermediate electrode CTE2 are provided as a single body, the first intermediate electrode CTE1 and the second intermediate electrode CTE2 may be different portions of the intermediate electrode CTE.

In the above-described embodiment, the first electrode EL1 of the first serial set SET1 may be the anode electrode of the light emitting unit EMU of each pixel PXL, and the second electrode EL2 of the second serial set SET2 may be the cathode electrode of the light emitting unit EMU.

FIG. 4 illustrates one or more embodiments in which all of the first to third transistors T1 to T3 are N-type transistors, but the present disclosure is not limited thereto. For example, at least one of the above-described first to third transistors T1 to T3 may be changed to a P-type transistor. Also, FIG. 4 illustrates one or more embodiments in which the light emitting unit EMU is connected between the pixel circuit PXC and the second driving power supply VSS, but the light emitting unit EMU may be alternatively connected between the first driving power supply VDD and the pixel circuit PXC.

The structure of the pixel circuit PXC may be variously suitably modified. For example, the pixel circuit PXC may further include at least one transistor element, such as a transistor element for initializing the first node N1 and/or a transistor element for controlling the emission time of the light emitting elements LD, and other circuit elements, a boosting capacitor for boosting the voltage of the first node N1, and/or the like.

The structure of the pixel PXL capable of being applied to the present disclosure is not limited to the embodiment illustrated in FIG. 4, and the pixel PXL may have any of various suitable structures. For example, each pixel PXL may be configured in a passive-type (or kind) light emitting display device, and/or the like. In this case, the pixel circuit PXC is omitted, and the opposite ends of the light emitting elements LD included in the light emitting unit EMU may be directly connected to the i-th scan line Si, the j-th data line Dj, the first power line PL1 through which the first driving power VDD is applied, the second power line PL2 through which the second driving power VSS is applied, and/or a predetermined (or specific) control line.

Figure 5:
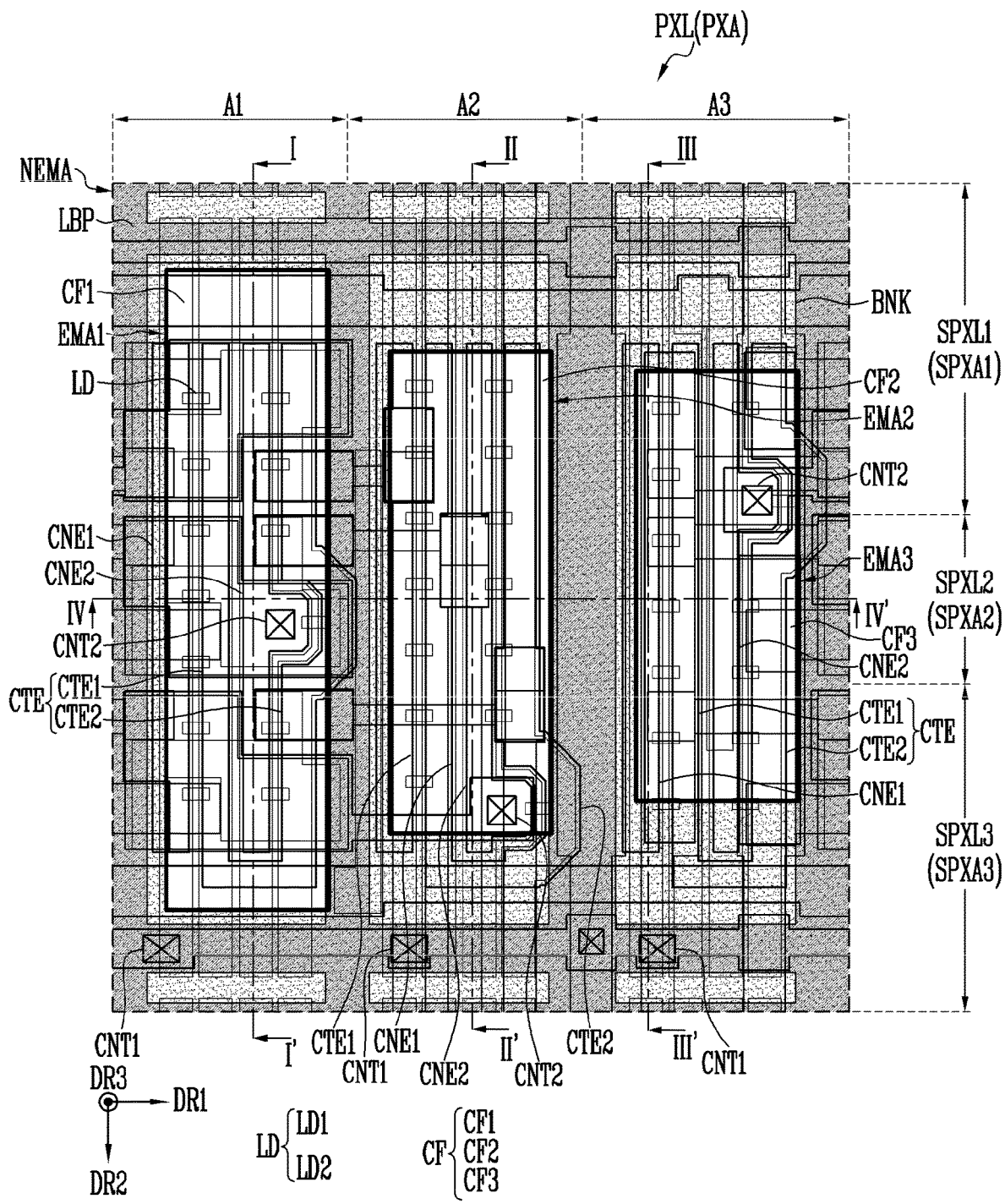
FIG. 5 is a plan diagram schematically illustrating one of the pixels illustrated in FIG. 3.

FIG. 5 is a plan diagram schematically illustrating one of the pixels illustrated in FIG. 3.

In one or more embodiments of the present disclosure, the lateral direction (or the horizontal direction) on a plane is represented as a first direction DR1, the longitudinal direction (or the vertical direction) on the plane is represented as a second direction DR2, and the direction of the thickness of a substrate SUB on the cross-section is represented as a third direction DR3 for the convenience of description.

The first to third directions DR1, DR2 and DR3 may be directions indicated by the first to third directions DR1, DR2 and DR3, respectively.

Referring to FIGS. 1 to 5, each pixel PXL may include first to third sub-pixels SPXL1 to SPXL3. The pixel area PXA in which each pixel PXL is provided may include a first sub-pixel area SPXA1 in which the first sub-pixel SPXL1 is provided, a second sub-pixel area SPXA2 in which the second sub-pixel SPXL2 is provided, and a third sub-pixel area SPXA3 in which the third sub-pixel SPXL3 is provided.

The first sub-pixel area SPXA1, the second sub-pixel area SPXA2, and the third sub-pixel area SPXA3 may be sequentially provided along the second direction DR2 in the pixel area PXA.

The pixel area PXA may be divided into a first area A1, a second area A2, and a third area A3 along a direction that is different from the second direction DR2, for example, along the first direction DR1 intersecting with the second direction DR2.

The first area A1 may include a first emission area EMA1, in which light is emitted, and a peripheral area (e.g., a non-emission area NEMA) adjacent to the first emission area EMA1 (or enclosing the periphery of the first emission area EMA1).

The second area A2 may include a second emission area EMA2, in which light is emitted, and a peripheral area (e.g., a non-emission area NEMA) adjacent to the second emission area EMA2 (or enclosing the periphery of the second emission area EMA2).

The third area A3 may include a third emission area EMA3, in which light is emitted, and a peripheral area (e.g., a non-emission area NEMA) adjacent to the third emission area EMA3 (or enclosing the periphery of the third emission area EMA3).

In each of the first to third emission areas EMA1 to EMA3, light emitting elements LD and connection electrodes (e.g., first and second contact electrodes CNE1 and CNE2, and an intermediate electrode CTE including first and second intermediate electrodes CTE1 and CTE2) electrically connected to the light emitting elements LD may be disposed.

In one or more embodiments of the present disclosure, the first emission area EMA1 may be the emission area of the second sub-pixel SPXL2, the second emission area EMA2 may be the emission area of the third sub-pixel SPXL3, and the third emission area EMA3 may be the emission area of the first sub-pixel SPXL1. In this case, the light emitting elements LD in the first emission area EMA1 may be electrically connected to some components of the second sub-pixel SPXL2 through first and second contact holes CNT1 and CNT2 corresponding thereto. The light emitting elements LD in the second emission area EMA2 may be electrically connected to some components of the third sub-pixel SPXL3 through first and second contact holes CNT1 and CNT2 corresponding thereto. The light emitting elements LD in the third emission area EMA3 may be electrically connected to some components of the first sub-pixel SPXL1 through first and second contact holes CNT1 and CNT2 corresponding thereto.

In one or more embodiments of the present disclosure, when each of the first to third sub-pixels SPXL1 to SPXL3 includes light emitting elements LD that are divided into two serial sets, as illustrated in FIG. 4, each of the first to third emission areas EMA1 to EMA3 may include the light emitting element LD in each of the two serial sets and an electrode connected to the light emitting element LD. For example, the emission area of each of the first to third sub-pixels SPXL1 to SPXL3 may include a plurality of light emitting elements LD in the respective first and second serial sets and a plurality of electrodes connected to the light emitting elements LD. In this case, at least one light emitting element LD in the first serial set and at least one light emitting element LD in the second serial set may be coupled in series to each other.

The structure of each pixel PXL including first to third sub-pixels SPXL1 to SPXL3 will be described in more detail hereinbelow with reference to FIGS. 6 to 12.

The remaining area of the pixel area PXA of each pixel PXL, excluding the above-described first to third emission areas EMA1 to EMA3, may be the non-emission area NEMA. A bank BNK may be in the non-emission area NEMA.

The bank BNK is a structure for defining (or dividing) the pixel areas PXA or the emission areas of a corresponding pixel PXL, and pixels PXL adjacent thereto, and may be, for example, a pixel definition layer. In one or more embodiments of the present disclosure, the bank BNK may be a structure for defining the first emission area EMA1, the second emission area EMA2, and the third emission area EMA3 of the corresponding pixel PXL. The bank BNK may be located in the area between the first to third emission areas EMA1 to EMA3, and outside the first to third emission areas EMA1 to EMA3.

The bank BNK may be a dam structure for defining each emission area, to which light emitting elements LD are to be supplied in the process of supplying the light emitting elements LD to each pixel PXL. For example, the first to third emission areas EMA1 to EMA3 are separated by the bank BNK, whereby the mixture (e.g., ink) including the desired amount and/or type (or kind) of light emitting elements may be supplied to each of the first to third emission areas EMA1 to EMA3.

Such bank BNK may include at least one light-blocking material and/or reflective material, thereby preventing or reducing a light leakage defect by which light is leaked between each sub-pixel and sub-pixels adjacent thereto. According to one or more embodiments, the bank BNK may include a transparent material (or substance). The transparent material may include, for example, a polyamide resin, a polyimide resin, and/or the like, but the present disclosure is not limited thereto. According to one or more embodiments, in order to further improve the efficiency of light emitted from each pixel PXL, a reflective material layer may be separately provided and/or formed on the bank BNK.

The bank BNK may include a plurality of open holes, which expose components located under the bank BNK, in each of the first to third areas A1 to A3. The first to third emission areas EMA1 to EMA3 may be defined by the open holes of the bank BNK. For example, the first emission area EMA1 may be defined by the open hole having the largest area, among the plurality of open holes of the bank BNK in the first area A1. The second emission area EMA2 may be defined by the open hole having the largest area, among the plurality of open holes of the bank BNK in the second area A2. The third emission area EMA3 may be defined by the open hole having the largest area, among the plurality of open holes of the bank BNK in the third area A3.

As described above, the bank BNK is in the non-emission area NEMA between the first to third emission areas EMA1 to EMA3, whereby the area to which the light emitting elements LD are to be supplied (or inserted) may be set in each of the first to third areas A1 to A3. The light emitting elements LD may then be supplied only to the supply area, whereby the material efficiency may be improved. Also, a defect that may occur when the light emitting elements LD are supplied to the area other than the supply area may be prevented or reduced, and the number of light emitting elements LD that can be used as effective (e.g., forward biased) light sources in each emission area may be increased. For example, at the step of supplying light emitting elements LD to each pixel PXL, the supply of the light emitting elements LD to the undesired area may be prevented or reduced, and the light emitting elements LD may be efficiently (or suitably) supplied to each of the first to third emission areas EMA1 to EMA3. Accordingly, the light emitting elements LD are prevented from being unnecessarily wasted, and the manufacturing cost of the display device may be reduced.

A light blocking pattern LBP and a color filter CF may be located above each pixel PXL.

The light blocking pattern LBP may be provided in the pixel area PXA of each pixel PXL so as to cover the peripheral area of the first to third emission areas EMA1 to EMA3, including the non-emission area NEMA between the first and third emission areas EMA1 to EMA3 of the pixel PXL.

The light blocking pattern LBP may be provided so as to correspond to the bank BNK in the peripheral area of the first to third emission areas EMA1 to EMA3, while enclosing the light emitting elements LD.

The light blocking pattern LBP may include a plurality of openings, each having a portion that is open, above each of the first to third emission areas EMA1 to EMA3. For example, the light blocking pattern LBP may be a black matrix pattern in which openings correspond to the first to third emission areas EMA1 to EMA3, respectively, and in which the remaining area, excluding the openings, is formed of a light-blocking material or the like.

The above-described light blocking pattern LBP may be provided on the bank BNK of each pixel PXL, and may include a light-blocking material for preventing (or reducing) a light leakage defect by which light is leaked between each of the first to third emission areas EMA1 to EMA3 and the emission areas adjacent thereto. Also, the light blocking pattern LBP may prevent (or reduce) the mixture of colors of light emitted from the respective pixels PXL adjacent to each other.

According to one or more embodiments, the light blocking pattern LBP includes at least one light-blocking material and/or reflective material, whereby light emitted from the light emitting elements LD in each of the first to third emission areas EMA1 to EMA3 may travel in the image-displaying direction of the display device. Accordingly, the light output efficiency of the light emitting elements LD may be improved.

Above the first to third emission areas EMA1 to EMA3, a color filter of a predetermined (or set) color corresponding to the color of light intended to be emitted from the corresponding emission area may be disposed. According to one or more embodiments of the present disclosure, color filter patterns of predetermined (or set) colors may be above the first to third emission areas EMA1 to EMA3 corresponding to the respective openings of the light blocking pattern LBP. For example, above each of the first to third emission areas EMA1 to EMA3 of each pixel PXL, a color filter pattern corresponding thereto may be disposed.

In one or more embodiments of the present disclosure, the color filter may include a first color filter pattern CF1, a second color filter pattern CF2, and a third color filter pattern CF3.

Each of the first to third color filter patterns CF1, CF2 and CF3 may be separated from the color filter pattern adjacent thereto with the light blocking pattern LBP therebetween. For example, the first color filter pattern CF1 may be separated from the second color filter pattern CF2 with the light blocking pattern LBP therebetween, and the second color filter pattern CF2 may be separated from the third color filter pattern CF3 with the light blocking pattern LBP therebetween.

The light blocking pattern LBP and the color filter CF will be described in more detail herein below along with the structures of the first to third sub-pixels SPXL1 to SPXL3.

Figure 6:
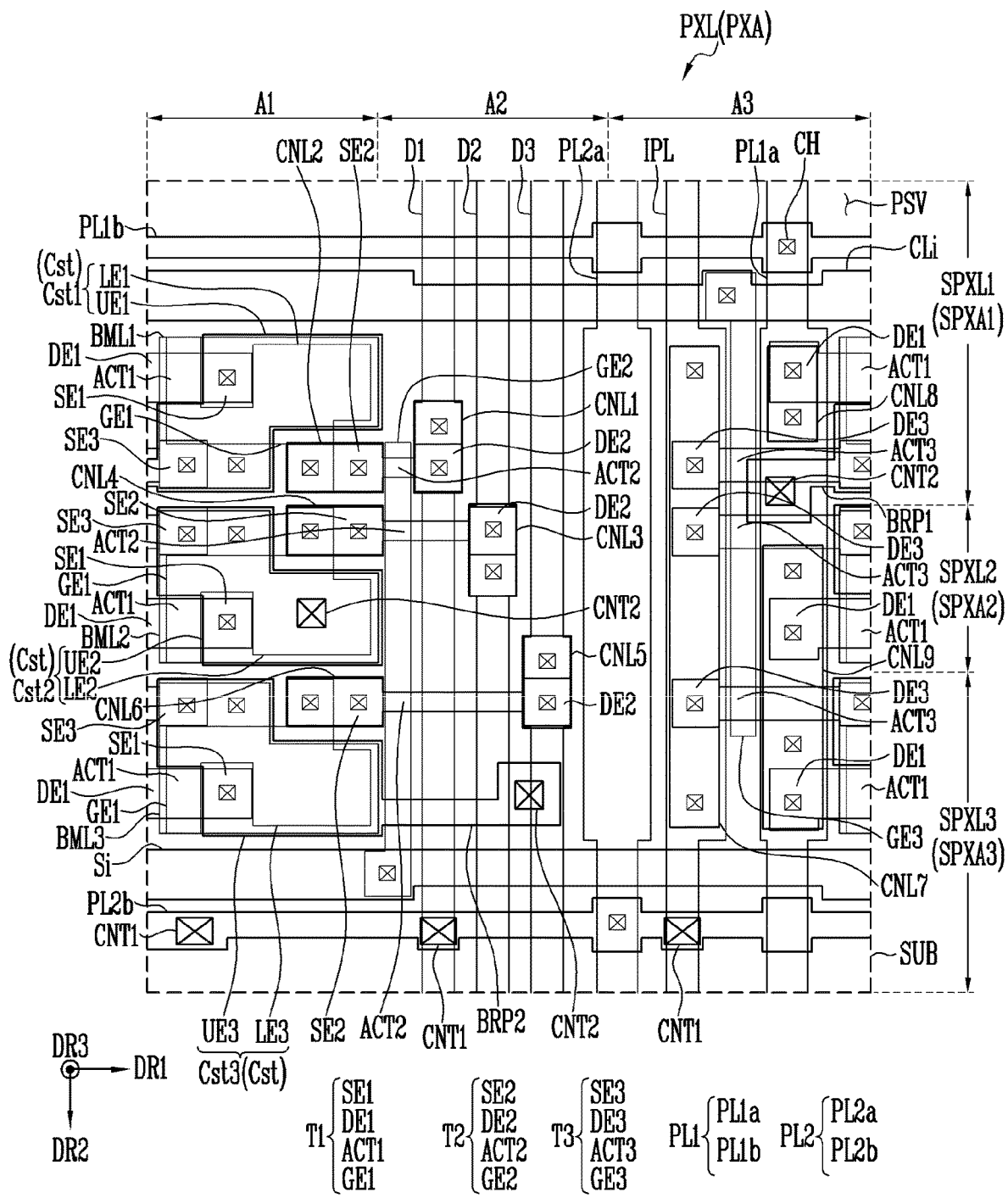
FIG. 6 is a plan diagram schematically illustrating an example of a pixel circuit layer included in the display device of FIG. 5.
Figure 7:
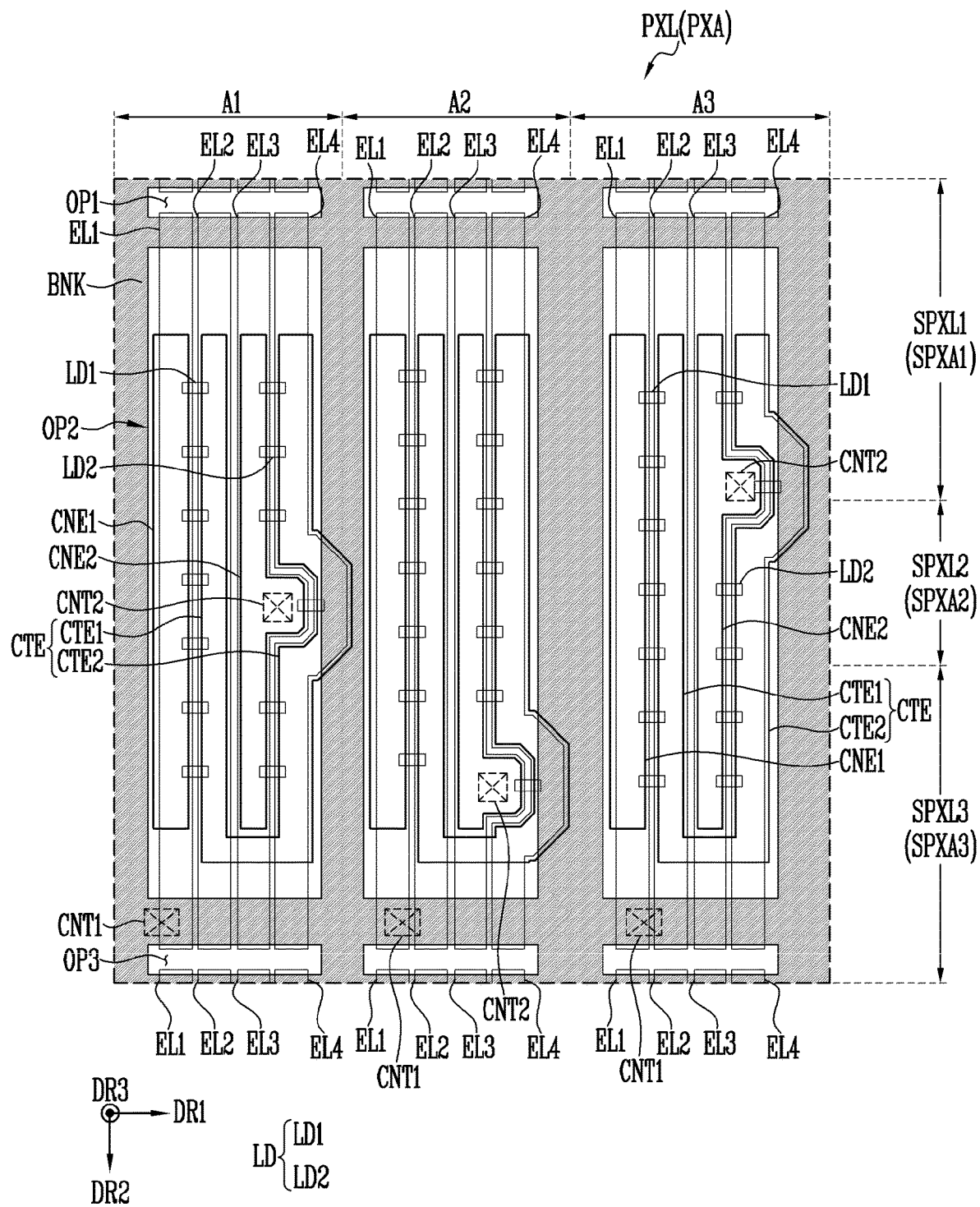
FIG. 7 is a plan diagram schematically illustrating an example of a display element layer included in the display device of FIG. 5.
Figure 8:
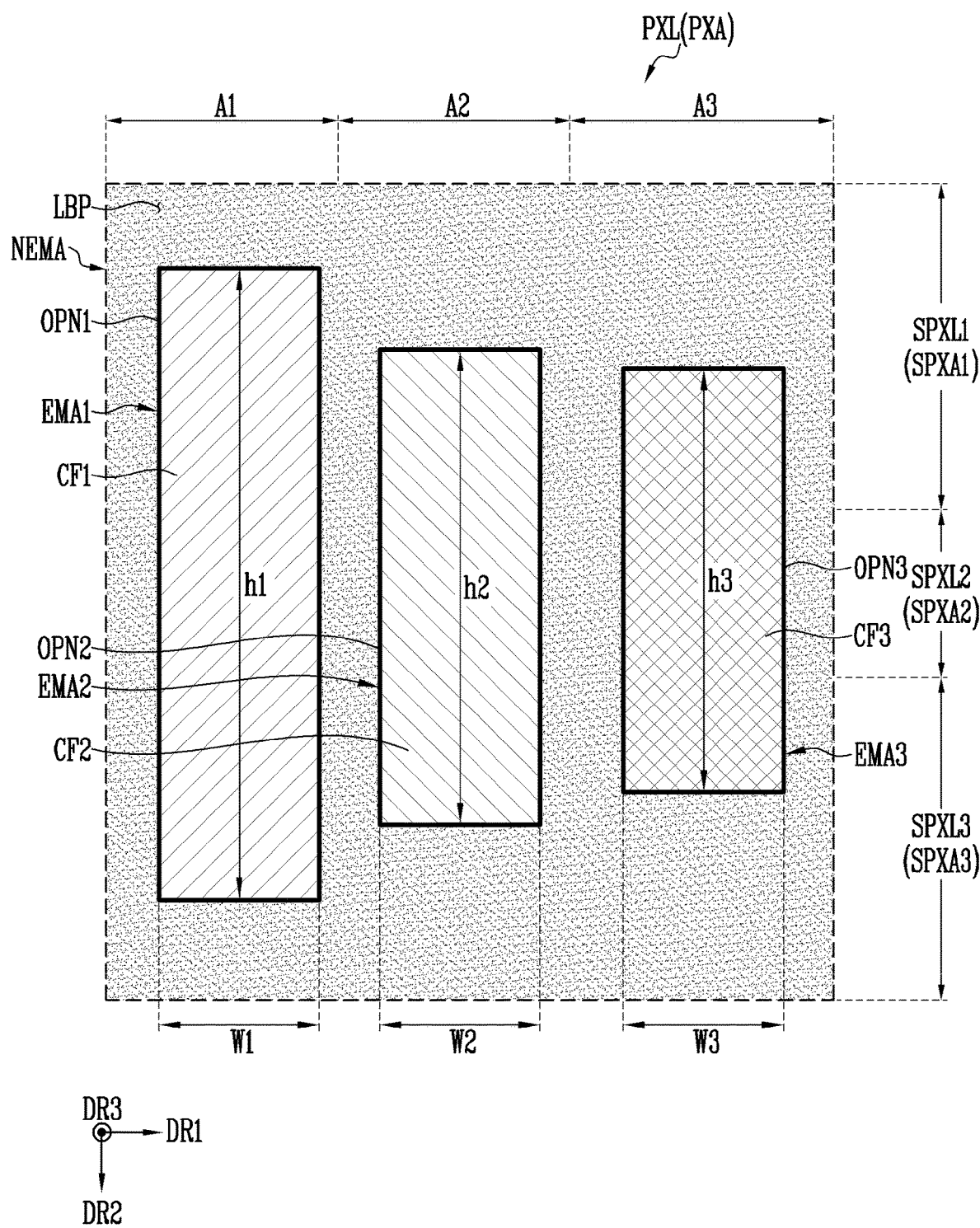
FIG. 8 is a plan diagram schematically illustrating an example of a color filter layer and a light blocking pattern included in the display device of FIG. 5.
Figure 9:
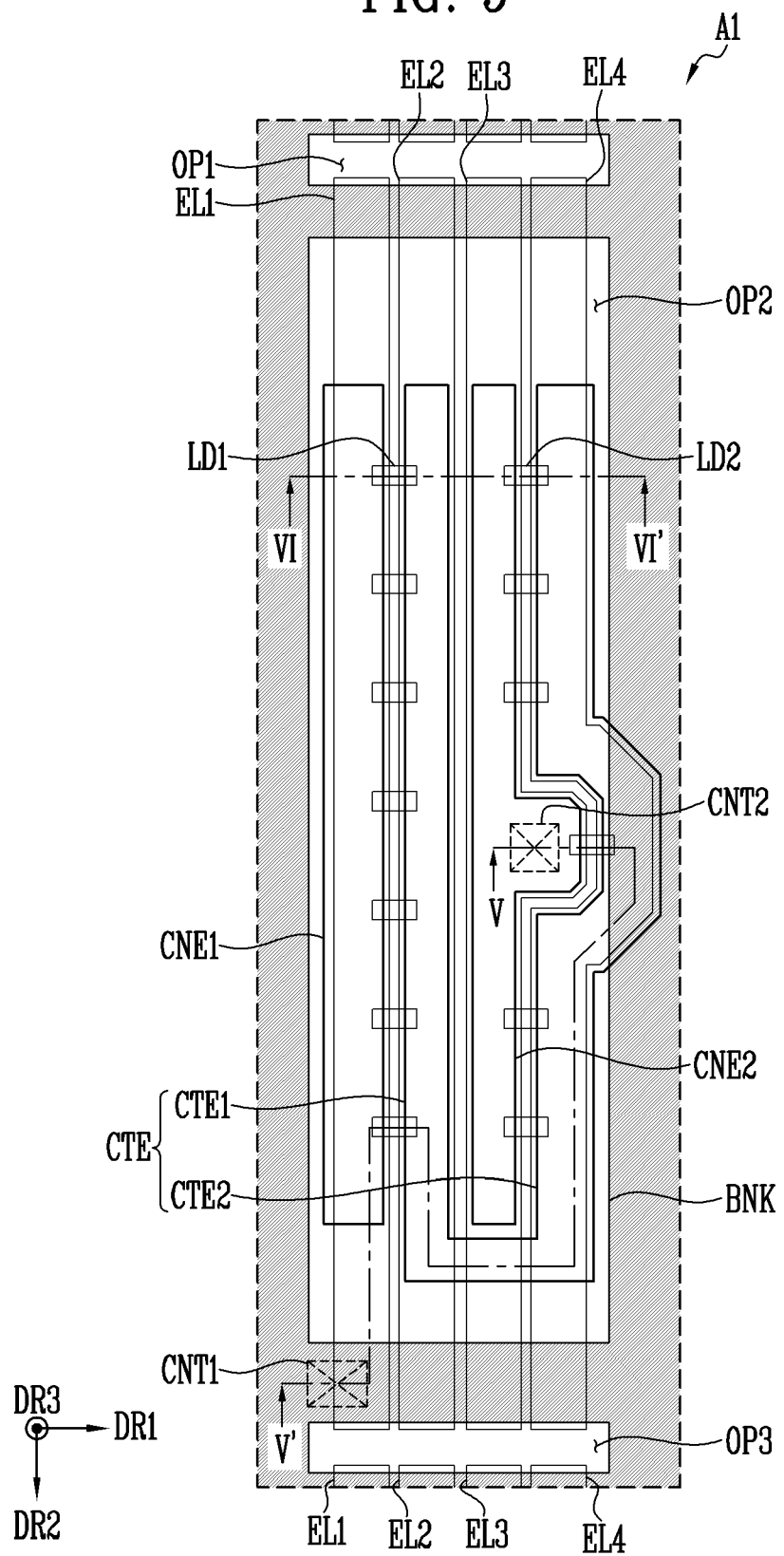
FIG. 9 is a plan diagram schematically illustrating only a first area A1 in FIG. 7.
Figure 10:
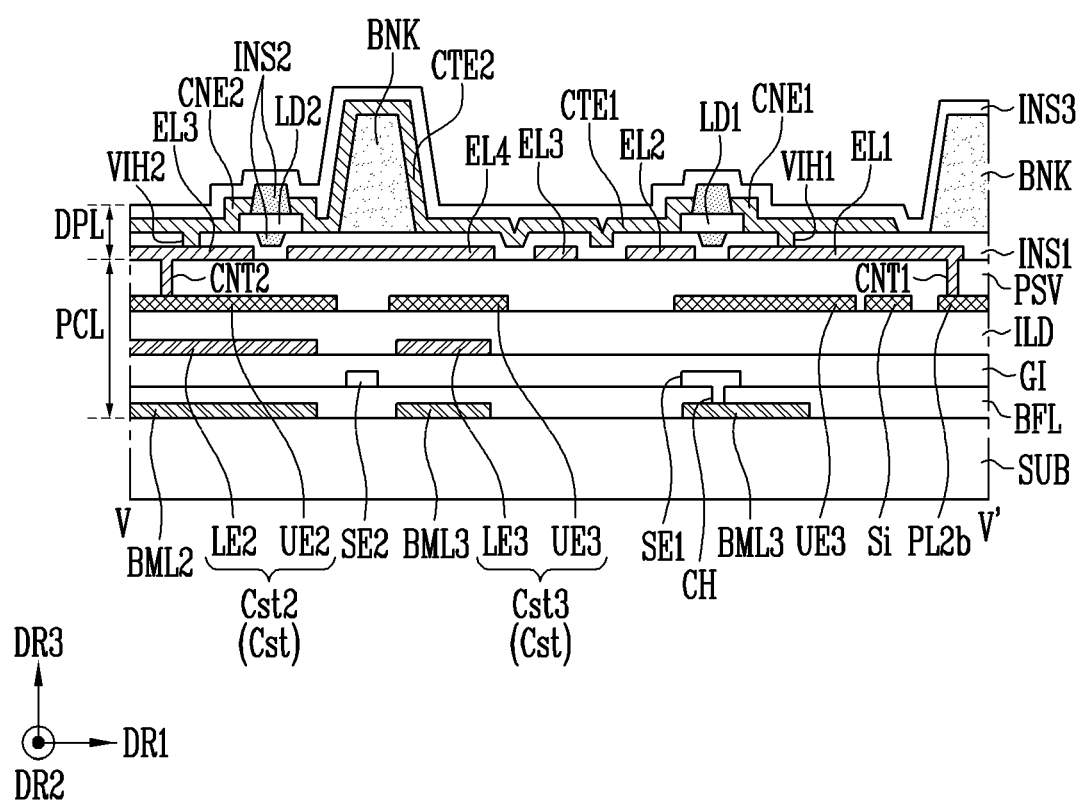
FIG. 10 is a cross-sectional diagram taken along the line V-V' in FIG. 9.

FIG. 6 is a plan diagram schematically illustrating an example of a pixel circuit layer included in the display device of FIG. 5. FIG. 7 is a plan diagram schematically illustrating an example of a display element layer included in the display device of FIG. 5. FIG. 8 is a plan diagram schematically illustrating an example of a color filter layer and a light blocking pattern included in the display device of FIG. 5. FIG. 9 is a plan diagram schematically illustrating only the first area of FIG. 7. FIG. 10 is a cross-sectional diagram taken along the line V-V of FIG. 9, and FIG. 11 and FIG. 12 are cross-sectional diagrams taken along the line VI-VI' of FIG. 9.

FIGS. 7 to 12 illustrate one or more embodiments in which the first to third emission areas EMA1 to EMA3 of each pixel PXL include light emitting elements LD in two serial sets. However, the present disclosure is not limited thereto, and the number of serial sets in each of the first to third emission areas EMA1 to EMA3 may be variously changed according to one or more embodiments.

Figure 11:
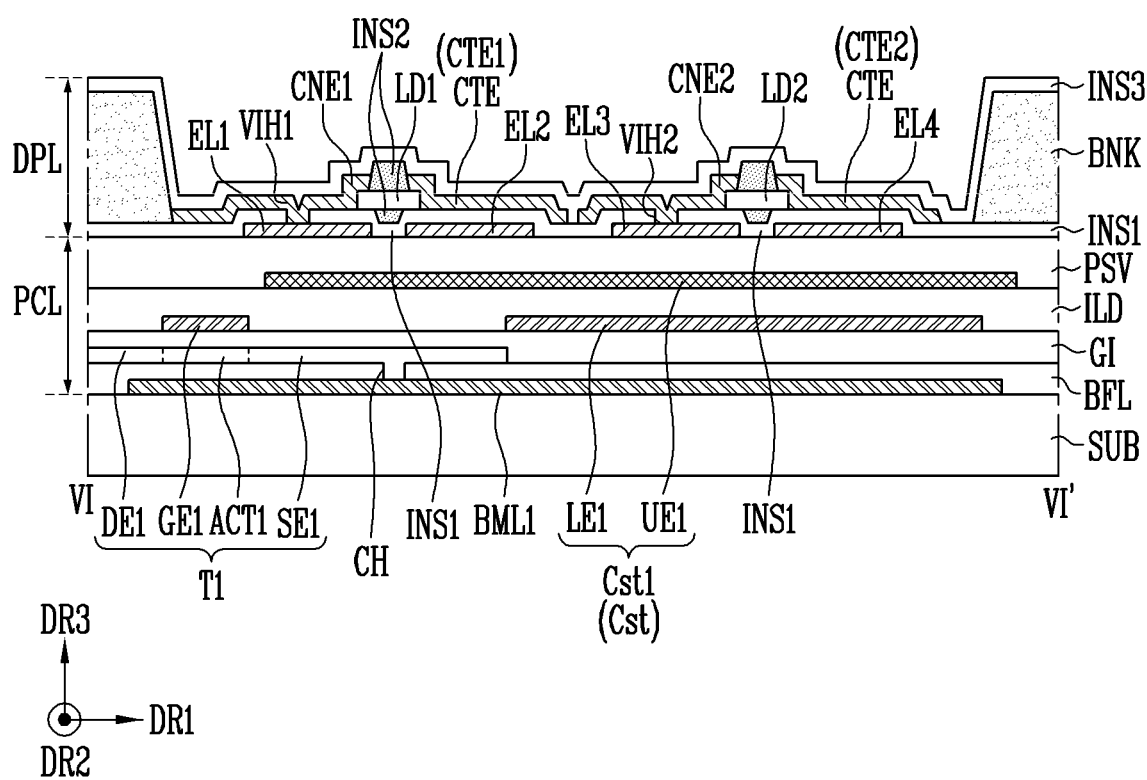
FIG. 11 and FIG. 12 are cross-sectional diagrams taken along the line VI-VI' in FIG. 9.
Figure 12:
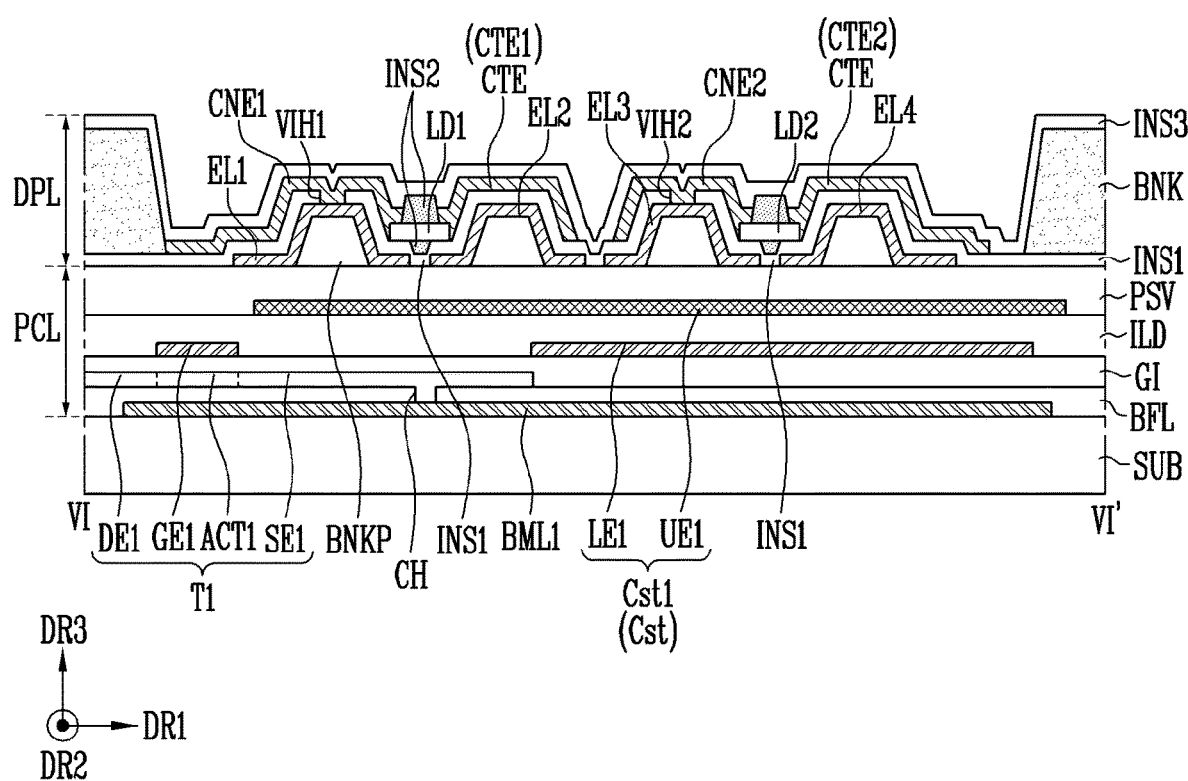

FIGS. 10 to 12 illustrate a single pixel PXL by simplifying the same in such a way that each electrode is illustrated as a single-layer electrode and that each insulating layer is illustrated as an insulating layer formed of a single layer, but the present disclosure is not limited thereto.

In one or more embodiments of the present disclosure, "connecting" between two components may be used as including both electrical connecting and physical connecting.

Also, in one or more embodiments of the present invention, when components are described as "being formed and/or provided on the same layer", this may indicate that the components are formed in the same process (e.g., are formed during the same act of the manufacturing process), whereas when components are described as "being formed and/or provided on different layers", this may indicate that the components are formed in different processes (e.g., during different acts of the manufacturing process).

Additionally, the first to third directions DR1, DR2 and DR3 may be directions indicated by the first to third directions DR1, DR2 and DR3, respectively, as in FIG. 5.

Referring to FIGS. 1 to 12, each pixel PXL may include a first sub-pixel SPXL1, a second sub-pixel SPXL2, and a third sub-pixel SPXL3.

An area in which the first sub-pixel SPXL1 is provided in the pixel area PXA of each pixel PXL may be a first sub-pixel area SPXA1, an area in which the second sub-pixel SPXL2 is provided in the pixel area PXA may be a second sub-pixel area SPXA2, and an area in which the third sub-pixel SPXL3 is provided in the pixel area PXA may be a third sub-pixel area SPXA3.

In one or more embodiments, the pixel area PXA in which each pixel PXL is provided may include a first area A1, a second area A2, and a third area A3 that are separated along the first direction DR1.

In one or more embodiments of the present disclosure, the first sub-pixel SPXL1 may be a blue pixel, the second sub-pixel SPXL2 may be a red pixel, and the third sub-pixel SPXL3 may be a green pixel. The emission area of the first sub-pixel SPXL1 may be the third emission area EMA3 of the third area A3, the emission area of the second sub-pixel SPXL2 may be the first emission area EMA1 of the first area A1, and the emission area of the third sub-pixel SPXL3 may be the second emission area EMA2 of the second area A2.

Each pixel PXL may include a substrate SUB, a pixel circuit layer PCL, and a display element layer DPL.

The substrate SUB may transmit light by including a transparent insulating material. The substrate SUB may be a rigid substrate or a flexible substrate.

The rigid substrate may be, for example, one of a glass substrate, a quartz substrate, a glass ceramic substrate, and a crystalline glass substrate.

The flexible substrate may be one of a film substrate including a polymer organic material and a plastic substrate. For example, the flexible substrate may include at least one of polystyrene, polyvinyl alcohol, polymethyl methacrylate, polyethersulfone, polyacrylate, polyetherimide, polyethylene naphthalate, polyethylene terephthalate, polyphenylene sulfide, polyarylate, polyimide, polycarbonate, triacetate cellulose, or cellulose acetate propionate.

It may be desirable for the material applied to the substrate SUB to have resistance (or heat resistance) to a high processing temperature in the process of manufacturing the display device.

A plurality of insulating layers and a plurality of conductive layers may be on the substrate SUB. For example, the insulating layers may include a buffer layer BFL, a gate insulating layer GI, an interlayer insulating layer ILD, a passivation layer PSV, and first to third insulating layers INS1 to INS3, which are sequentially provided on the substrate SUB. The conductive layers may be provided and/or formed between the above-described insulating layers. For example, the conductive layers may include a first conductive layer provided on the substrate SUB, a second conductive layer provided on the gate insulating layer GI, a third conductive layer provided on the interlayer insulating layer ILD, a fourth conductive layer provided on the passivation layer PSV, and a fifth conductive layer provided on the second insulating layer INS2. However, the insulating layers and the conductive layers provided on the substrate SUB are not limited to the above-described embodiment, and in addition to the insulating layers and the conductive layers, other insulating layers and/or other conductive layers may be provided on the substrate SUB according to one or more embodiments.

A line component electrically connected to each pixel PXL may be located on the substrate SUB. The line component may include a plurality of signal lines configured to transmit a predetermined (or set) signal (or a predetermined or set voltage) to each pixel PXL. The signal lines may include a scan line Si, data lines D1 to D3, a control line CLi, a first power line PL1, a second power line PL2, and an initialization power line IPL.

The scan line Si may extend in the first direction DR1. A scan signal may be applied to the scan line Si. The scan line Si may be the i-th scan line Si described with reference to FIG. 4. The scan line Si may be the third conductive layer provided on the interlayer insulating layer ILD. The third conductive layer may be a single layer formed of a single material or a compound of materials selected from a group comprising copper (Cu), molybdenum (Mo), tungsten (W), aluminum neodymium (AlNd), titanium (Ti), aluminum (Al), silver (Ag), and alloys thereof, or may be a double-layer or multi-layer structure of molybdenum (Mo), titanium (Ti), copper (Cu), aluminum (Al), and/or silver (Ag), which are materials having low resistance, in order to reduce wire resistance.

The interlayer insulating layer ILD may be an inorganic insulating layer including an inorganic material. For example, the interlayer insulating layer ILD may include at least one of metal oxides selected from silicon nitride ($SiN_x$), silicon oxide ($SiO_x$), silicon oxynitride ($SiO_xN_y$), and/or aluminum oxide ($AlO_x$). However, the material of the interlayer insulating layer ILD is not limited to the above-described embodiments. According to one or more embodiments, the interlayer insulating layer ILD may be formed of an organic insulating layer including an organic material. The interlayer insulating layer ILD may be provided as a single layer, but may be alternatively provided as a multi-layer structure having two or more layers.

The data lines D1 to D3 are spaced apart from each other along the first direction DR1, and may include a first data line D1, a second data line D2, and a third data line D3 extending in the direction different from the first direction DR1, for example, in the second direction DR2 intersecting with the first direction DR1. A data signal corresponding to each of the first to third data lines D1 to D3 may be applied thereto. Each of the first to third data lines D1 to D3 may be the j-th data line Dj described with reference to FIG. 4. The first data line D1 may be electrically connected to the second transistor T2 of the first sub-pixel SPXL1, the second data line D2 may be electrically connected to the second transistor T2 of the second sub-pixel SPXL2, and the third data line D3 may be electrically connected to the second transistor T2 of the third sub-pixel SPXL3. The first to third data lines D1 to D3 may be the first conductive layer provided on the substrate SUB. The first conductive layer may include the same material as the third conductive layer, or may include one or more materials selected from among the materials exemplified as the material forming the third conductive layer.

The control line CLi may extend along the first direction DR1 while being spaced apart from the scan line Si. A control signal may be applied to the control line CLi. The control line CLi may be the i-th control line CLi described with reference to FIG. 4. The control line CLi may be provided and/or formed on the same layer as the scan line Si. For example, the control line CLi may be the third conductive layer provided on the interlayer insulating layer ILD.

The voltage of a first driving power supply VDD may be applied to the first power line PL1. The first power line PL1 may be the first power line PL1 described with reference to FIG. 4. The first power line PL1 may include a 1a-th power line PL1*a* and a 1b-th power line PL1*b*.

The 1a-th power line PL1*a* may extend along the second direction DR2. The 1a-th power line PL1*a* may be the first conductive layer provided and/or formed on the substrate SUB. The 1a-th power line PL1*a* may be provided on the same layer as the first to third data lines D1 to D3, and may be spaced apart from the first to third data lines D1 to D3 in a plan view.

The 1b-th power line PL1*b* may extend along the first direction DR1. The 1b-th power line PL1*b* may be the third conductive layer provided and/or formed on the interlayer insulating layer ILD. The 1b-th power line PL1*b* may be provided on the same layer as the control line CLi, and may be spaced apart from the control line CLi in a plan view.

The 1a-th power line PL1*a* and the 1b-th power line PL1*b* may be electrically connected to each other through a contact hole CH corresponding thereto. For example, the 1a-th power line PL1*a* and the 1b-th power line PL1*b* may be electrically connected to each other through the contact hole CH sequentially passing through the buffer layer BFL, the gate insulating layer GI, and the interlayer insulating layer ILD. The first power line PL1 including the 1a-th power line PL1*a* and the 1b-th power line PL1*b*, which are electrically connected to each other, may have a mesh structure.

The voltage of a second driving power supply VSS may be applied to the second power line PL2. The second power line PL2 may be the second power line PL2 described with reference to FIG. 4. The second power line PL2 may include a 2a-th power line PL2*a* and a 2b-th power line PL2*b*.

The 2a-th power line PL2*a* may extend along the second direction DR2. The 2a-th power line PL2*a* may be the first conductive layer provided and/or formed on the substrate SUB. The 2a-th power line PL2*a* may be provided on the same layer as the first to third data lines D1 to D3 and the 1a-th power line PL1*a*, and may be spaced apart from the first to third data lines D1 to D3 and the 1a-th power line PL1*a* in a plan view.

The 2b-th power line PL2*b* may extend along the first direction DR1. The 2b-th power line PL2*b* may be the third conductive layer provided and/or formed on the interlayer insulating layer ILD. The 2b-th power line PL2*b* may be provided on the same layer as the scan line Si, and may be spaced apart from the scan line Si in a plan view.

The 2a-th power line PL2*a* and the 2b-th power line PL2*b* may be electrically connected to each other through a contact hole CH corresponding thereto. For example, the 2a-th power line PL2*a* and the 2b-th power line PL2*b* may be electrically connected to each other through the contact hole CH sequentially passing through the buffer layer BFL, the gate insulating layer GI, and the interlayer insulating layer ILD. The second power line PL2 including the 2a-th power line PL2*a* and the 2b-th power line PL2*b*, which are electrically connected to each other, may have a mesh structure.

The initialization power line IPL may extend in the second direction DR2, and may be between the 2a-th power line PL2*a* and the 1a-th power line PL1*a*. The initialization power line IPL may be the j-th sensing line SENj described with reference to FIG. 4. The initialization power line IPL may be electrically connected to some components (e.g., the third transistor T3) in each of the first to third sub-pixel areas SPXA1 to SPXA3 through a seventh connection line CNL7. The voltage of an initialization power supply may be applied to the initialization power line IPL. The initialization power line IPL may be the first conductive layer provided on the substrate SUB. The initialization power line IPL may be provided and/or formed on the same layer as the first to third data lines D1 to D3 and the 1a-th and 2a-th power lines PL1*a* and PL2*a*.

The seventh connection line CNL7 may extend in the second direction DR2, and may overlap the initialization power line IPL in a plan view. The seventh connection line CNL7 may be electrically connected to the initialization power line IPL through a contact hole CH corresponding thereto. For example, the seventh connection line CNL7 may be electrically connected to the initialization power line IPL through at least two contact holes CH sequentially passing through the buffer layer BFL, the gate insulating layer GI, and the interlayer insulating layer ILD. In one or more embodiments, the seventh connection line CNL7 may be electrically connected to the third transistor T3 in each of the first to third sub-pixels SPXL1 to SPXL3 through a corresponding contact hole CH sequentially passing through the gate insulating layer GI and the interlayer insulating layer ILD. For example, the seventh connection line CNL7 may be electrically connected to the third transistor T3 of the first sub-pixel SPXL1 through a contact hole CH sequentially passing through the gate insulating layer GI and the interlayer insulating layer ILD, may be electrically connected to the third transistor T3 of the second sub-pixel SPXL2 through a contact hole CH sequentially passing through the gate insulating layer GI and the interlayer insulating layer ILD, and may be electrically connected to the third transistor T3 of the third sub-pixel SPXL3 through a contact hole CH sequentially passing through the gate insulating layer GI and the interlayer insulating layer ILD.

The first and second power lines PL1 and PL2 and the initialization power line IPL, described above, may be common components that are provided in common to the first to third sub-pixel areas SPXA1 to SPXA3.

Each of the first to third sub-pixels SPXL1 to SPXL3 may include a pixel circuit layer PCL including a pixel circuit PXC.

The first sub-pixel SPXL1, the second sub-pixel SPXL2, and the third sub-pixel SPXL3 may have structures that are similar to or the same as each other. Hereinafter, the first sub-pixel SPXL1, among the first to third sub-pixels SPXL1 to SPXL3, will be described as a representative thereof for the convenience, and the second and third sub-pixels SPXL2 and SPXL3 will be briefly described.

The first sub-pixel SPXL1 may include a pixel circuit layer PCL provided on the substrate SUB and including a pixel circuit PXC.

The pixel circuit layer PCL may include a buffer layer BFL, a pixel circuit PXC, and a passivation layer PSV.

The buffer layer BFL may be provided on the first conductive layer, and may prevent impurities from diffusing into the pixel circuit PXC. The buffer layer BFL may be an inorganic insulating layer including an inorganic material. The buffer layer BFL may include at least one of metal oxides selected from silicon nitride ($SiN_x$), silicon oxide ($SiO_x$), silicon oxynitride ($SiO_xN_y$), and aluminum oxide ($AlO_x$). The buffer layer BFL may be provided as a single layer, but may be provided as a multi-layer structure having two or more layers. When the buffer layer BFL is provided as a multi-layer structure, respective layers therein may be formed of the same material or different materials. The buffer layer BFL may be omitted depending on the material of the substrate SUB, process conditions, and/or the like.

The pixel circuit PXC may include first to third transistors T1 to T3 and a first storage capacitor Cst1 provided on the buffer layer BFL.

The first transistor T1 may be the first transistor T1 described with reference to FIG. 4, the second transistor T2 may be the second transistor T2 described with reference to FIG. 4, and the third transistor T3 may be the third transistor T3 described with reference to FIG. 4.

The first transistor T1 may include a first gate electrode GE1, a first active pattern ACT1, a first source area SE1, and a first drain area DE1.

The first gate electrode GE1 may be connected to the second source area SE2 of the second transistor T2 through a second connection line CNL2. The first gate electrode GE1 may be provided and/or formed on the gate insulating layer GI. The first gate electrode GE1 may be the second conductive layer provided and/or formed on the gate insulating layer GI. The second conductive layer may be a single layer formed of a single material or a compound of materials selected from a group comprising copper (Cu), molybdenum (Mo), tungsten (W), aluminum neodymium (AlNd), titanium (Ti), aluminum (Al), silver (Ag), and alloys thereof, or may be a double-layer or multi-layer structure of molybdenum (Mo), titanium (Ti), copper (Cu), aluminum (Al), and/or silver (Ag), which are materials having low resistance, in order to reduce wire resistance.

The gate insulating layer GI may include the same material as the interlayer insulating layer ILD, or may include one or more materials selected from among the materials exemplified as the materials for forming the interlayer insulating layer ILD. The gate insulating layer GI may be provided as a single layer, but may be provided as a multi-layer structure having two or more layers.

The second connection line CNL2 may be the third conductive layer provided and/or formed on the interlayer insulating layer ILD. The first end of the second connection line CNL2 may be electrically connected to the first gate electrode GE1 through a contact hole CH passing through the interlayer insulating layer ILD. The second end of the second connection line CNL2 may be electrically connected to the second source area SE2 of the second transistor T2 through a contact hole CH sequentially passing through the gate insulating layer GI and the interlayer insulating layer ILD.

The first active pattern ACT1, the first source area SE1, and the first drain area DE1 may be a semiconductor pattern formed of polysilicon, amorphous silicon, an oxide semiconductor, and/or the like. The first active pattern ACT1, the first source area SE1, and the first drain area DE1 may each independently be formed as a semiconductor layer that is doped with impurities or is not doped with impurities. For example, the first source area SE1 and the first drain area DE1 may be formed as a semiconductor layer doped with impurities, and the first active pattern ACT1 may be formed as a semiconductor layer that is not doped with impurities. As the impurities, an n-type impurity may be used.

The first active pattern ACT1, the first source area SE1, and the first drain area DE1 may be provided and/or formed on the buffer layer BFL.

The first active pattern ACT1 may be the area overlapping the first gate electrode GE1, and may be the channel area of the first transistor T1. When the first active pattern ACT1 is formed in an elongated shape, the channel area of the first transistor T1 may be formed in an elongated shape. In this case, the driving range of the gate voltage (or the gate signal) applied to the first transistor T1 may be widened. Accordingly, the grayscale of light emitted from the light emitting elements LD may be minutely (or suitably) controlled.

The first source area SE1 may be connected to (or be in contact (e.g., physical contact) with) the first end of the first active pattern ACT1. In one or more embodiments, the first source area SE1 may be electrically connected to a first bottom metal layer BML1 through a contact hole CH passing through the buffer layer BFL.

The first bottom metal layer BML1 may be the first conductive layer provided and/or formed on the substrate SUB. The first bottom metal layer BML1 may be provided and/or formed on the same layer as the first to third data lines D1 to D3, the 1a-th and 2a-th power lines PL1a and PL2a, and the initialization power line IPL. The first bottom metal layer BML1 may be electrically connected to the first source area SE1 of the first transistor T1 through the corresponding contact hole CH.

The first drain area DE1 may be connected to (or in be contact (e.g., physical contact) with) the second end of the first active pattern ACT1. In one or more embodiments, the first drain area DE1 may be electrically connected to the 1a-th power line PL1a through an eighth connection line CNL8.

The first end of the eighth connection line CNL8 may be connected to the first drain area DE1 through a contact hole CH sequentially passing through the gate insulating layer GI and the interlayer insulating layer ILD. In one or more embodiments, the second end of the eighth connection line CNL8 may be electrically connected to the 1a-th power line PL1a through a contact hole CH sequentially passing through the buffer layer BFL, the gate insulating layer GI, and the interlayer insulating layer ILD. The eighth connection line CNL8 may electrically connect the first drain area DE1 to the 1a-th power line PL1a.

The second transistor T2 may include a second gate electrode GE2, a second active pattern ACT2, a second source area SE2, and a second drain area DE2.

The second gate electrode GE2 may extend along the second direction DR2, and may be a common component provided (or disposed) in common to the first to third sub-pixels SPXL1 to SPXL3. The second gate electrode GE2 may be the second conductive layer provided and/or formed on the gate insulating layer GI. The second gate electrode GE2 may be electrically connected to the scan line Si through a contact hole CH passing through the interlayer insulating layer ILD. Accordingly, a scan signal applied to the scan line Si may be transmitted to the second gate electrode GE2.

In the above-described embodiment, the second gate electrode GE2 is described as being electrically connected to the scan line Si through the corresponding contact hole CH by being provided as a component separate from the scan line Si, but the present disclosure is not limited thereto. According to one or more embodiments, the second gate electrode GE2 may be integrated with the scan line Si. In this case, the second gate electrode GE2 may be provided as a portion of the scan line Si, or may be provided in a shape protruding from the scan line Si.

The second active pattern ACT2, the second source area SE2, and the second drain area DE2 may be a semiconductor pattern formed of polysilicon, amorphous silicon, an oxide semiconductor, and/or the like. The second active pattern ACT2, the second source area SE2, and the second drain area DE2 may be formed as a semiconductor layer that is doped with impurities or is not doped with impurities. For example, the second source area SE2 and the second drain area DE2 may be formed as a semiconductor layer doped with impurities, and the second active pattern ACT2 may be formed as a semiconductor layer that is not doped with impurities. As the impurities, an n-type impurity may be used.

The second active pattern ACT2, the second source area SE2, and the second drain area DE2 may be provided and/or formed on the buffer layer BFL.

The second active pattern ACT2 may be the area overlapping the second gate electrode GE2, and may be the channel area of the second transistor T2.

The second source area SE2 may be connected to (or be in contact (e.g., physical contact) with) the first end of the second active pattern ACT2. In one or more embodiments, the second source area SE2 may be connected to the first gate electrode GE1 of the first transistor T1 through the second connection line CNL2.

The second drain area DE2 may be connected to (or be in contact (e.g., physical contact) with) the second end of the second active pattern ACT2. In one or more embodiments, the second drain area DE2 may be connected to the first data line D1 through a first connection line CNL1.

The first connection line CNL1 may be the third conductive layer provided and/or formed on the interlayer insulating layer ILD. The first end of the first connection line CNL1 may be electrically connected to the first data line D1 through a contact hole CH sequentially passing through the buffer layer BFL, the gate insulating layer GI, and the interlayer insulating layer ILD. The second end of the first connection line CNL1 may be connected to the second drain area DE2 through a contact hole CH sequentially passing through the gate insulating layer GI and the interlayer insulating layer ILD. The second drain area DE2 and the first data line D1 may be electrically connected to each other through the first connection line CNL1.

The third transistor T3 may include a third gate electrode GE3, a third active pattern ACT3, a third source area SE3, and a third drain area DE3.

The third gate electrode GE3 may extend along the second direction DR2, and may be a common component provided (or disposed) in common to the first to third sub-pixels SPXL1 to SPXL3. The third gate electrode GE3 may be the second conductive layer provided and/or formed on the gate insulating layer GI. The third gate electrode GE3 may be electrically connected to the control line CLi through a contact hole CH passing through the interlayer insulating layer ILD. Accordingly, a control signal applied to the control line CLi may be transmitted to the third gate electrode GE3.

In the above-described embodiment, the third gate electrode GE3 is described as being electrically connected to the control line CLi through the corresponding contact hole CH by being provided as a component separate from the control line CLi, but the present disclosure is not limited thereto. According to one or more embodiments, the third gate electrode GE3 may be integrated with the control line CLi. In this case, the third gate electrode GE3 may be provided as a portion of the control line CLi, or may be provided in a shape protruding from the control line CLi.

The third active pattern ACT3, the third source area SE3, and the third drain area DE3 may be a semiconductor pattern formed of polysilicon, amorphous silicon, an oxide semiconductor, and/or the like. The third active pattern ACT3, the third source area SE3, and the third drain area DE3 may each independently be formed as a semiconductor layer that is doped with impurities or is not doped with impurities. For example, the third source area SE3 and the third drain area DE3 may be formed as a semiconductor layer doped with impurities, and the third active pattern ACT3 may be formed as a semiconductor layer that is not doped with impurities. As the impurities, an n-type impurity may be used.

The third active pattern ACT3, the third source area SE3, and the third drain area DE3 may be provided and/or formed on the buffer layer BFL.

The third active pattern ACT3 may be an area overlapping the third gate electrode GE3, and may be the channel area of the third transistor T3.

The third source area SE3 may be connected to (or be in contact (e.g., physical contact) with) the first end of the third active pattern ACT3. In one or more embodiments, the third source area SE3 may be electrically connected to the first bottom metal layer BML1 through a contact hole CH passing through the buffer layer BFL.

The third drain area DE3 may be connected to (or be in contact (e.g., physical contact) with) the second end of the third active pattern ACT3. In one or more embodiments, the third drain area DE3 may be electrically connected to the initialization power line IPL through the seventh connection line CNL7.

The first storage capacitor Cst1 may include a first lower electrode LE1 and a first upper electrode UE1. Here, the first storage capacitor Cst1 may be the storage capacitor Cst described with reference to FIG. 4.

The first lower electrode LE1 may be integrated with the first gate electrode GE1. When the first lower electrode LE1 is integrated with the first gate electrode GE1, the first lower electrode LE1 may be a portion of the first gate electrode GE1.

The first upper electrode UE1 may overlap the first lower electrode LE1 in a plan view, and may have a larger area (or size) than the first lower electrode LE1. The first upper electrode UE1 may overlap each of the first and third source areas SE1 and SE3 in a plan view. The first upper electrode UE1 may be the third conductive layer provided and/or formed on the interlayer insulating layer ILD. The first upper electrode UE1 may be provided and/or formed on the same layer as the scan line Si, the control line CLi, and the 1b-th and 2b-th power lines PL1*b* and PL2*b*. In one or more embodiments of the present disclosure, the first upper electrode UE1 may include a first bridge pattern BRP1 extending to the pixel area PXA of the adjacent pixels PXL along the first direction DR1. The first bridge pattern BRP1 may be integrated with the first upper electrode UE1. In this case, the first bridge pattern BRP1 may be a portion of the first upper electrode UE1.

The first upper electrode UE1 may be electrically connected to the first bottom metal layer BML1 through a contact hole CH sequentially passing through the buffer layer BFL, the gate insulating layer GI, and the interlayer insulating layer ILD. The first upper electrode UE1, the first source area SE1 of the first transistor T1, and the third source area DE3 of the third transistor T3 may be connected to each other through the first bottom metal layer BML1.

In the second sub-pixel area SPXA2, in which the second sub-pixel SPXL2 is disposed, first to third transistors T1 to T3, a second storage capacitor Cst2, and a second bottom metal layer BML2 may be disposed.

The first transistor T1 of the second sub-pixel SPXL2 may include a first gate electrode GE1, a first active pattern ACT1, a first source area SE1, and a first drain area DE1.

The first drain area DE1 of the first transistor T1 may be electrically connected to the 1a-th power line PL1*a* through a ninth connection line CNL9.

The ninth connection line CNL9 may be the third conductive layer provided and/or formed on the interlayer insulating layer ILD. The ninth connection line CNL9 may be electrically connected to the 1a-th power line PL1*a* through a contact hole CH sequentially passing through the buffer layer BFL, the gate insulating layer GI, and the interlayer insulating layer ILD. In one or more embodiments, the ninth connection line CNL9 may be electrically connected to the first drain area DE1 through a contact hole CH sequentially passing through the gate insulating layer GI and the interlayer insulating layer ILD.

The second transistor T2 of the second sub-pixel SPXL2 may include a second gate electrode GE2, a second active pattern ACT2, a second source area SE2, and a second drain area DE2.

The second source area SE2 of the second transistor T2 may be electrically connected to the first gate electrode GE1 of the first transistor T1 of the second sub-pixel SPXL2 through a fourth connection line CNL4.

The fourth connection line CNL4 may be the third conductive layer provided and/or formed on the interlayer insulating layer ILD. The first end of the fourth connection line CNL4 may be electrically connected to the first gate electrode GE1 through a contact hole CH passing through the interlayer insulating layer ILD. The second end of the fourth connection line CNL4 may be electrically connected to the second source area SE2 through a contact hole CH sequentially passing through the gate insulating layer GI and the interlayer insulating layer ILD.

The second drain area DE2 of the second transistor T2 of the second sub-pixel SPXL2 may be electrically connected to the second data line D2 through a third connection line CNL3. Here, the third connection line CNL3 may be the third conductive layer provided and/or formed on the interlayer insulating layer ILD. The first end of the third connection line CNL3 may be electrically connected to the second data line D2 through a contact hole CH sequentially passing through the buffer layer BFL, the gate insulating layer GI, and the interlayer insulating layer ILD. The second end of the third connection line CNL3 may be electrically connected to the second drain area DE2 through a contact hole CH sequentially passing through the gate insulating layer GI and the interlayer insulating layer ILD.

The second storage capacitor Cst2 may have substantially the same structure as the above-described first storage capacitor Cst1 of the first sub-pixel SPXL1. For example, the second storage capacitor Cst2 may include a second lower electrode LE2 and a second upper electrode UE2. The second lower electrode LE2 may be the second conductive layer provided on the gate insulating layer GI. The second lower electrode LE2 may be integrated with the first gate electrode GE1 of the first transistor T1 of the second sub-pixel SPXL2. The second upper electrode UE2 may be the third conductive layer provided on the interlayer insulating layer ILD, and may overlap the second lower electrode LE2 in a plan view.

The second bottom metal layer BML2 may be provided and/or formed on the same layer as the first bottom metal layer BML1. For example, the second bottom metal layer BML2 may be the first conductive layer provided on the substrate SUB. The second bottom metal layer BML2 may be electrically connected to the first source area SE1, the third source area SE3, and the second upper electrode UE2. Specifically, the second bottom metal layer BML2 may be electrically connected to each of the first and third source areas SE1 and SE3 through a contact hole CH passing through the buffer layer BFL. In one or more embodiments, the second bottom metal layer BML2 may be electrically connected to the second upper electrode UE2 through a contact hole CH sequentially passing through the buffer layer BFL, the gate insulating layer GI, and the interlayer insulating layer ILD. The first and third source areas SE1 and SE3 and the second upper electrode UE2 may be electrically connected to each other through the second bottom metal layer BML2.

In the third sub-pixel area SPXA3, in which the third sub-pixel SPXL3 is disposed, first to third transistors T1 to T3, a third storage capacitor Cst3, and a third bottom metal layer BML3 may be disposed.

The first transistor T1 of the third sub-pixel SPXL3 may include a first gate electrode GE1, a first active pattern ACT1, a first source area SE1, and a first drain area DE1.

The first drain area DE1 of the first transistor T1 may be electrically connected to the 1a-th power line PL1a through the ninth connection line CNL9. The ninth connection line CNL9 may be electrically connected to the 1a-th power line PL1a through a contact hole CH sequentially passing through the buffer layer BFL, the gate insulating layer GI, and the interlayer insulating layer ILD. In one or more embodiments, the ninth connection line CNL9 may be electrically connected to the first drain area DE1 through a contact hole CH sequentially passing through the gate insulating layer GI and the interlayer insulating layer ILD.

The second transistor T2 of the third sub-pixel SPXL3 may include a second gate electrode GE2, a second active pattern ACT2, a second source area SE2, and a second drain area DE2.

The second source area SE2 of the second transistor T2 of the third sub-pixel SPXL3 may be electrically connected to the first gate electrode GE1 of the first transistor T1 of the third sub-pixel SPXL3 through a sixth connection line CNL6.

The sixth connection line CNL6 may be the third conductive layer provided and/or formed on the interlayer insulating layer ILD. The first end of the sixth connection line CNL6 may be electrically connected to the first gate electrode GE1 through a contact hole CH passing through the interlayer insulating layer ILD. The second end of the sixth connection line CNL6 may be electrically connected to the second source area SE2 through a contact hole CH sequentially passing through the gate insulating layer GI and the interlayer insulating layer ILD.

The second drain area DE2 of the second transistor T2 of the third sub-pixel SPXL3 may be electrically connected to the third data line D3 through a fifth connection line CNL5. Here, the fifth connection line CNL5 may be the third conductive layer provided and/or formed on the interlayer insulating layer ILD. The first end of the fifth connection line CNL5 may be electrically connected to the third data line D3 through a contact hole CH sequentially passing through the buffer layer BFL, the gate insulating layer GI, and the interlayer insulating layer ILD. The second end of the fifth connection line CNL5 may be electrically connected to the second drain area DE2 through a contact hole CH sequentially passing through the gate insulating layer GI and the interlayer insulating layer ILD.

The third storage capacitor Cst3 may include a third lower electrode LE3 and a third upper electrode UE3.

The third lower electrode LE3 may be the second conductive layer provided on the gate insulating layer GI. The third lower electrode LE3 may be provided by being integrated with the first gate electrode GE1 of the first transistor T1 of the third sub-pixel SPXL3.

The third upper electrode UE3 may be the third conductive layer provided on the interlayer insulating layer ILD, and may overlap the third lower electrode LE3 in a plan view. In one or more embodiments of the present disclosure, the third upper electrode UE3 may include a second bridge pattern BRP2 extending to the pixel area PXA of the adjacent pixels PXL along the first direction DR1. The second bridge pattern BRP2 may be integrated with the third upper electrode UE3. In this case, the second bridge pattern BRP2 may be a portion of the third upper electrode UE3.

The third bottom metal layer BML3 may be provided and/or formed on the same layer as the first and second bottom metal layers BML1 and BML2. For example, the third bottom metal layer BML3 may be the first conductive layer provided on the substrate SUB. The third bottom metal layer BML3 may be electrically connected to the first source area SE1, the third source area SE3, and the third upper electrode UE3. For example, the third bottom metal layer BML3 may be electrically connected to each of the first and third source areas SE1 and SE3 through a contact hole CH passing through the buffer layer BFL. In one or more embodiments, the third bottom metal layer BML3 may be electrically connected to the third upper electrode UE3 through a contact hole CH sequentially passing through the buffer layer BFL, the gate insulating layer GI, and the interlayer insulating layer ILD. The first and third source areas SE1 and SE3 and the third upper electrode UE3 may be electrically connected to each other through the third bottom metal layer BML3.

The passivation layer PSV may be provided and/or formed on the scan line Si, the control line CLi, the 1b-th and 2b-th power lines PL1b and PL2b, the first to ninth connection lines CNL1 to CNL9, and the first to third upper electrodes UE1 to UE3, which are described above.

The passivation layer PSV may be provided in the form including an organic insulating layer, an inorganic insulating layer, or an organic insulating layer on an inorganic insulating layer. The inorganic insulating layer may include, for example, at least one of metal oxides selected from silicon oxide ($SiO_x$), silicon nitride ($SiN_x$), silicon oxynitride ($SiO_xN_y$), and aluminum oxide ($AlO_x$). The organic insulating layer may include, for example, at least one selected from polyacrylates resin, epoxy resin, phenolic resin, polyamides resin, polyimides resin, unsaturated polyesters resin, poly-phenylene ethers resin, poly-phenylene sulfides resin, and benzocyclobutene resin.

The passivation layer PSV may include a first contact hole CNT1 and a second contact hole CNT2. The second contact hole CNT2 may expose each of a portion of the first upper electrode UE1 (e.g., a portion of the first bridge pattern BRP1), a portion of the second upper electrode UE2, and a portion of the third upper electrode UE3 (e.g., a portion of the second bridge pattern BRP2). The first contact hole CNT1 may expose each of a first portion of the 2b-th power lien PL2b, a second portion of the 2b-th power line PL2b, and a third portion of the 2b-th power line PL2b. In one or more embodiments of the present disclosure, the number of first contact holes CNT1 provided in the pixel area PXA of each pixel PXL may be three, and the number of second contact holes CNT2 provided in the pixel area PXA may be three.

As illustrated in FIG. 7 and FIGS. 9 to 12, each of the first to third sub-pixels SPXL1 to SPXL3 may include a display element layer DPL including light emitting elements LD. The display element layer DPL of the first sub-pixel SPXL1 may be located in the third area A3 of the pixel area PXA of each pixel PXL, the display element layer DPL of the second sub-pixel SPXL2 may be located in the first area A1 of the corresponding pixel area PXA, and the display element layer DPL of the third sub-pixel SPXL3 may be located in the second area A2 of the corresponding pixel area PXA. In one or more embodiments, the display element layer DPL of each of the first to third sub-pixels SPXL1 to SPXL3 may correspond to the emission area of each of the first to third sub-pixels SPXL1 to SPXL3. For example, the display element layer DPL of the first sub-pixel SPXL1 may correspond to the third emission area EMA3, the display element layer DPL of the second sub-pixel SPXL2 may correspond to the first emission area EMA1, and the display element layer DPL of the third sub-pixel SPXL3 may correspond to the second emission area EMA2.

The display element layer DPL of each of the first to third sub-pixels SPXL1 to SPXL3 may be provided and/or formed on the passivation layer PSV.

The display element layer DPL may include a bank BNK, first to fourth electrodes EL1 to EL4, light emitting elements LD, first and second contact electrodes CNE1 and CNE2, an intermediate electrode CTE, and first to third insulating layers INS1 to INS3.

Because the bank BNK corresponds to the same component as the bank BNK described with reference to FIG. 5, it will be only briefly described hereinbelow.

The bank BNK may include first to third open holes OP1 to OP3 that expose components located under the bank BNK in each of the first to third areas A1 to A3.

The first to third emission areas EMA1 to EMA3 of each pixel PXL may be defined by the second open hole OP2 of the bank BNK. For example, the first emission area EMA1 may be defined by the second open hole OP2 of the bank BNK in the first area A1, the second emission area EMA2 may be defined by the second open hole OP2 of the bank BNK in the second area A2, and the third emission area EMA3 may be defined by the second open hole OP2 of the bank BNK in the third area A3.

In each of the first to third areas A1 to A3, each of the first and third open holes OP1 and OP3 of the bank BNK may be located by being spaced apart from the second open hole OP2 thereof, and may be located so as to be close to one side of the corresponding area (e.g., the lower side and the upper side). For example, in each of the first to third areas A1 to A3, the first open hole OP1 of the bank BNK may be located so as to be close to the upper side in a plan view, and the third open hole OP3 of the bank BNK may be located so as to be close to the lower side in a plan view.

The size and shape of the second open hole OP2 of the bank BNK in the first area A1, the size and shape of the second open hole OP2 of the bank BNK in the second area A2, and the size and shape of the second open hole OP2 of the bank BNK in the third area A3 may be the same as each other. For example, the size and shape of the second open hole OP2 of the bank BNK located in each of the first to third areas A1 to A3 may be the same as the size and the shape of the second open hole OP2 of the bank BNK located in the area adjacent thereto along the first direction DR1. However, the present disclosure is not limited thereto, and according to one or more embodiments, the size of the second open hole OP2 of the bank BNK corresponding to each of the first to third emission areas EMA1 to EMA3 may be set in consideration of the efficiency of light (e.g., a color reproduction rate, and/or the like) that is finally emitted from the first to third emission areas EMA1 to EMA3.

The bank BNK may be provided and/or formed on the first insulating layer INS1, but the present disclosure is not limited thereto. According to one or more embodiments, the bank BNK may be alternatively provided and/or formed on the passivation layer PSV.

The first electrode EL1, the second electrode EL2, the third electrode EL3, and the fourth electrode EL4 may be sequentially arranged along the first direction DR1 on the passivation layer PSV of each of the first to third areas A1 to A3. The first to fourth electrodes EL1 to EL4 may be a fourth conductive layer provided and/or formed on the passivation layer PSV.

The first electrode EL1, the second electrode EL2, the third electrode EL3, and the fourth electrode EL4 may extend in the second direction DR2. The ends of each of the first to fourth electrodes EL1 to EL4 may be located in the first open hole OP1 and the third open hole OP3 of the bank BNK. The first to fourth electrodes EL1 to EL4 may be separated from other electrodes (e.g., from the first to fourth electrodes provided to the pixels PXL adjacent thereto in the second direction DR2) in each of the first and third open holes OP1 and OP3, after the light emitting elements LD are supplied to and arranged in each of the first to third emission areas EMA1 to EMA3 in the process of manufacturing the display device. Each of the first and third open holes OP1 and OP3 of the bank BNK may be provided for (e.g., to assist in facilitating) the separation process for the first electrode EL1, the second electrode EL2, the third electrode EL3, and the fourth electrode EL4.

Each of the first to fourth electrodes EL1 to EL4 may be spaced apart from the electrode adjacent thereto along the first direction DR1 in each of the first to third areas A1 to A3. For example, the first electrode EL1 may be spaced apart from the second electrode EL2, the second electrode EL2 may be spaced apart from the third electrode EL3, and the third electrode EL3 may be spaced apart from the fourth electrode EL4. The distance between the first electrode EL1 and the second electrode EL2, the distance between the second electrode EL2 and the third electrode EL3, and the distance between the third electrode EL3 and the fourth electrode EL4 may be the same as each other, but the present disclosure is not limited thereto. According to one or more embodiments, the distance between the first electrode EL1 and the second electrode EL2, the distance between the second electrode EL2 and the third electrode EL3, and the distance between the third electrode EL3 and the fourth electrode EL4 may be different from each other.

The first to fourth electrodes EL1 to EL4 may be formed of a material having a constant reflectivity, in order to make light emitted from each of the light emitting elements LD travel in the image-displaying direction (e.g., a frontward direction) of the display device. For example, the first to fourth electrodes EL1 to EL4 may be formed of a conductive material (or substance) having a constant reflectivity. The conductive material (or substance) may include opaque metal that is advantageous (or suitable) to reflect light, emitted from the light emitting elements LD, in the image-displaying direction of the display device. The opaque metal may include, for example, a metal such as silver (Ag), magnesium (Mg), aluminum (Al), platinum (Pt), palladium (Pd), gold (Au), nickel (Ni), neodymium (Nd), iridium (Ir), chromium (Cr), titanium (Ti), and/or an alloy thereof. According to one or more embodiments, the first to fourth electrodes EL1 to EL4 may include a transparent conductive material (or substance). The transparent conductive material (or substance) may include a conductive oxide (such as indium tin oxide (ITO), indium zinc oxide (IZO), zinc oxide (ZnO), indium gallium zinc oxide (IGZO), and/or indium tin zinc oxide (ITZO)), a conductive polymer (such as poly(3, 4-ethylenedioxythiophene) (PEDOT)), and/or the like. When the first to fourth electrodes EL1 to EL4 include a transparent conductive material (or substance), a separate conductive layer formed of opaque metal may be added in order to reflect light, emitted from the light emitting elements LD, in the image-displaying direction of the display device. However, the material of the first to fourth electrodes EL1 to EL4 is not limited to the above-mentioned materials.

In one or more embodiments, each of the first to fourth electrodes EL1 to EL4 may be provided and/or formed as a single layer, but the present disclosure is not limited thereto. According to one or more embodiments, each of the first to fourth electrodes EL1 to EL4 may be provided and/or formed as a multi-layer structure in which at least two materials, selected among a metal, an alloy, a conductive oxide, and a conductive polymer, are stacked. Each of the first to fourth electrodes EL1 to EL4 may be formed as a multi-layer structure having two or more layers, in order to minimize (or reduce) distortion that may be caused by a signal delay, when a signal (or voltage) is transmitted to the opposite ends of each of the light emitting elements LD. For example, each of the first to fourth electrodes EL1 to EL4 may be formed as a multi-layer structure, in which indium tin oxide (ITO), silver (Ag), and/or indium tin oxide (ITO) are sequentially stacked.

In each of the first to third areas A1 to A3, the first electrode EL1 may be electrically connected to some components of the corresponding pixel circuit layer PCL through the first contact hole CNT1 of the passivation layer PSV. For example, the first electrode EL1 of the first area A1 may be electrically connected to the 2b-th power line PL2$b$, corresponding to the first area A1, through one of the three first contact holes CNT1 of the passivation layer PSV. The first electrode EL1 of the second area A2 may be electrically connected to the 2b-th power line PL2$b$, corresponding to the second area A2, through another one of the three first contact holes CNT1. The first electrode EL1 of the third area A3 may be electrically connected to the 2b-th power line PL2$b$, corresponding to the third area A3, through the remaining one of the three first contact holes CNT1.

In each of the first to third areas A1 to A3, the third electrode EL3 may be electrically connected to some components of the corresponding pixel circuit layer PCL through the second contact hole CNT2 of the passivation layer PSV. For example, the third electrode EL3 of the first area A1 may be electrically connected to the second upper electrode UE2, corresponding to the first area A1, through one of the three second contact holes CNT2 of the passivation layer PSV. The third electrode EL3 of the second area A2 may be electrically connected to the second bridge pattern BRP2, corresponding to the second area A2, through another one of the three second contact holes CNT2. The third electrode EL3 of the third area A3 may be electrically connected to the first bridge pattern BRP1, corresponding to the third area A3, through the remaining one of the three second contact holes CNT2. As described above, because the first bridge pattern BRP1 is a portion of the first upper electrode UE1, the third electrode EL3 of the third area A3 may be electrically connected to the first upper electrode UE1. Also, because the second bridge pattern BRP2 is a portion of the third upper electrode UE3, the third electrode EL3 of the second area A2 may be electrically connected to the third upper electrode UE3.

In each of the first to third areas A1 to A3, the first electrode EL1 may be substantially the same component as the second electrode EL2 described with reference to FIG. 4, and the third electrode EL3 may be substantially the same component as the first electrode EL1 described with reference to FIG. 4.

According to one or more embodiments, a supporting member may be located between each of the first to fourth electrodes EL1 to EL4 and the passivation layer PSV in each of the first to third areas A1 to A3. For example, a bank pattern BNKP may be located between each of the first to fourth electrodes EL1 to EL4 and the passivation layer PSV, as illustrated in FIG. 12.

The bank pattern BNKP may be located in the emission area of each pixel PXL. For example, the bank pattern BNKP may be located in each of the first to third emission areas EMA1 to EMA3. The bank pattern BNKP may be a supporting member for supporting the first to fourth electrodes EL1 to EL4, in order to change the surface profile (or shape) of each of the first to fourth electrodes EL1 to EL4 in the corresponding area, such that light emitted from the light emitting elements LD is induced to travel in the image-displaying direction of the display device.

The bank pattern BNKP may be provided between the passivation layer PSV and the first to fourth electrodes EL1 to EL4 in the corresponding emission area. For example, the bank pattern BNKP may be provided between the passivation layer PSV and the first to fourth electrodes EL1 to EL4 in each of the first to third emission areas EMA1 to EMA3.

The bank pattern BNKP may be an inorganic insulating layer including an inorganic material, or an organic insulating layer including an organic material. According to one or more embodiments, the bank pattern BNKP may include a single organic insulating layer and/or a single inorganic insulating layer, but the present disclosure is not limited thereto. According to one or more embodiments, the bank pattern BNKP may be provided in the form of a multi-layer structure, in which at least one organic insulating layer and at least one inorganic insulating layer are stacked. However, the material of the bank pattern BNKP is not limited to the above-described embodiment, and according to one or more embodiments, the bank pattern BNKP may include a conductive material (or substance).

The bank pattern BNKP may have a cross-section having a trapezoid shape, the width of which decreases towards the upper portion thereof from one surface (e.g., the upper surface) of the passivation layer PSV along the third direction DR3, but the present disclosure is not limited thereto. According to one or more embodiments, the bank pattern BNKP may include a curved surface having a cross-section of a semielliptical shape, the width of which decreases towards the upper portion thereof from one surface of the passivation layer PSV along the third direction DR3, a cross-section of a semicircular shape (or a hemisphere shape), and/or the like. In a cross-sectional view, the shape of the bank pattern BNKP is not limited to the above-described embodiments, and may be variously suitably changed within a range in which the efficiency of light emitted from each of the light emitting elements LD can be improved.

Each of the first to fourth electrodes EL1 to EL4 may be provided and/or formed on the bank pattern BNKP. Accordingly, each of the first to fourth electrodes EL1 to EL4 has a surface profile corresponding to the shape of the bank pattern BNKP thereunder, and light emitted from the light emitting elements LD is reflected by each of the first to fourth electrodes EL1 to EL4, thereby further traveling in the image-displaying direction of the display device. The bank pattern BNKP and each of the first to fourth electrodes EL1 to EL4 induce light emitted from the light emitting elements LD to travel in the desired direction, thereby functioning as a reflective member for improving the light efficiency of the display device. When each pixel PXL does not include the bank pattern BNKP, the first to fourth electrodes EL1 to EL4 may be provided and/or formed on one surface (e.g., the upper surface) of the passivation layer PSV.

Each of the first to fourth electrodes EL1 to EL4 may be used as an alignment electrode (or alignment line) for alignment of the light emitting elements LD, by receiving a predetermined (or set) alignment signal (or alignment voltage) before the light emitting elements LD are aligned in the pixel area PXA of each pixel PXL. For example, each of the first to fourth electrodes EL1 to EL4 may be used as an alignment electrode for alignment of the light emitting elements LD by receiving a predetermined (or set) alignment signal before the light emitting elements LD are aligned in the first to third emission areas EMA1 to EMA3 defined (or separated) by the bank BNK.

In each of the first to third areas A1 to A3, the first electrode EL1 may be used as a first alignment electrode (or a first alignment line) by receiving a first alignment signal (or a first alignment voltage), the second electrode EL2 may be used as a second alignment electrode (or a second alignment line) by receiving a second alignment signal (or a second alignment voltage), the third electrode EL3 may be used as a third alignment electrode (or a third alignment line) by receiving a third alignment signal (or a third alignment voltage), and the fourth electrode EL4 may be used as a fourth alignment electrode (or a fourth alignment line) by receiving a fourth alignment signal (or a fourth alignment voltage). Here the first and fourth alignment signals may be the same alignment signal, and the second and third alignment signals may be the same alignment signal. The first and fourth alignment signals and the second and third alignment signals may be signals having a voltage difference and/or a phase difference by which the light emitting elements LD can be aligned between the two adjacent electrodes. Among the first and fourth alignment signals and the second and third alignment signals, at least the first and fourth alignment signals may be alternating current (AC) signals (or voltages), but the present disclosure is not limited thereto, and at least the second and third alignment signals may be AC signals (or voltages).

After the light emitting elements LD are aligned in each of the first to third emission areas EMA1 to EMA3, a portion of each of the first to fourth electrodes EL1 to EL4 located between sub-pixels that are adjacent in the second direction DR2 is removed in order to drive each of the first to third sub-pixels SPXL1 to SPXL3 independently of the sub-pixels adjacent thereto in the second direction DR2, whereby the ends of each of the first to fourth electrodes EL1 to EL4 may be located in the first and third open holes OP1 and OP3 of the bank BNK, respectively.

After the light emitting elements LD are aligned in each of the first to third emission areas EMA1 to EMA3, each of the first to fourth electrodes EL1 to EL4 may function as a driving electrode for driving the light emitting elements LD.

In each of the first to third emission areas EMA1 to EMA3 of each pixel PXL, the third electrode EL3 and the fourth electrode EL4 may form a first serial set SET1 along with a plurality of light emitting elements LD connected in parallel to each other therebetween, and the first electrode EL1 and the second electrode EL2 may form a second serial set SET2 along with a plurality of light emitting elements LD connected in parallel to each other therebetween.

In one or more embodiments of the present disclosure, the first and second serial sets SET1 and SET2 are in each of the first to third emission areas EMA1 to EMA3 of each pixel PXL, and the first and second serial sets SET1 and SET2 may form the light emitting unit EMU of each of the first to third sub-pixels SPXL1 to SPXL3.

The third electrode EL3 included in the first serial set SET1 may be the anode electrode of the light emitting unit EMU of each of the first to third sub-pixels SPXL1 to SPXL3, and the first electrode EL1 included in the second serial set SET2 may be the cathode electrode of the light emitting unit EMU.

Each of the light emitting elements LD may be a subminiature light emitting diode that has a nanoscale to microscale size and uses a material having an inorganic crystalline structure. Each of the light emitting elements LD may be a subminiature light emitting diode fabricated using an etching method or fabricated using a growth method.

In each of the first to third emission areas EMA1 to EMA3, at least two to dozens of light emitting elements LD may be aligned and/or provided, but the number of light emitting elements LD is not limited thereto. According to one or more embodiments, the number of light emitting elements LD aligned and/or provided in each of the first to third emission areas EMA1 to EMA3 may be variously suitably changed.

Each of the light emitting elements LD may emit any one of color light and/or white light. Each of the light emitting elements LD may be aligned on the first insulating layer INS1 between two adjacent electrodes, among the first to fourth electrodes EL1 to EL4, such that the direction in which the light emitting element LD extends (or the direction of the length L) is parallel to the first direction DR1 in a plan view or a cross-sectional view. The light emitting elements LD are provided by being sprayed in the solution, thereby being supplied to each of the first to third emission areas EMA1 to EMA3.

The light emitting elements LD may be supplied to each of the first to third emission areas EMA1 to EMA3 of each pixel PXL using an inkjet printing method, a slit coating method, or any of various other suitable methods. For example, the light emitting elements LD may be mixed with a volatile solvent, and may then be supplied to the pixel area PXA through an inkjet printing method or a slit coating method. Here, when an alignment signal corresponding to each of the first to fourth electrodes EL1 to EL4 provided to each of the first to third emission areas EMA1 to EMA3 is applied, an electric field may be formed between two adjacent electrodes among the first to fourth electrodes EL1 to EL4. Accordingly, the light emitting elements LD may be aligned between two adjacent electrodes among the first to fourth electrodes EL1 to EL4. As described above, because the same alignment signal (or alignment voltage) is applied to each of the second and third electrodes EL2 and EL3, no light emitting elements LD may be aligned between the second electrode EL2 and the third electrode EL3. However, the present disclosure is not limited thereto. According to one or more embodiments, when an alignment signal is applied to each of the second and third electrodes EL2 and EL3, the wire resistance of the two electrodes, the effect of an electric field induced between the adjacent electrodes, and/or the like may cause a potential difference between the alignment signals applied to the second electrode EL2 and the third electrode EL3. In this case, the light emitting elements LD may be aligned between the second and third electrodes EL2 and EL3.

After the light emitting elements LD are aligned, the solvent is removed by being volatilized or by using another suitable solvent removal method, whereby the light emitting elements LD may be finally aligned and/or provided in each of the first to third emission areas EMA1 to EMA3.

In FIG. 5, FIG. 7, and FIG. 9, an example in which the light emitting elements LD, the length (L) direction of which is parallel to the first direction DR1, are aligned between the two adjacent electrodes among the first to fourth electrodes EL1 to EL4 is illustrated, but the present disclosure is not limited thereto. According to one or more embodiments, some of the light emitting elements LD may be aligned between two adjacent electrodes, such that the direction of the length L thereof is parallel to the second direction DR2 and/or the direction inclined to the second direction DR2. According to one or more embodiments, at least one reverse light emitting element (LDr in FIG. 4) connected in a reverse direction between the two adjacent electrodes may be further disposed.

In one or more embodiments of the present disclosure, the light emitting elements LD may include a plurality of first light emitting elements LD1 and a plurality of second light emitting elements LD2.

The first light emitting elements LD1 may be between the first electrode EL1 and the second electrode EL2. The second light emitting elements LD2 may be between the third electrode EL3 and the fourth electrode EL4.

The first light emitting elements LD1 may be aligned in the same direction between the first electrode EL1 and the second electrode EL2. The first electrode EL1 and the second electrode EL2 may form the second serial set SET2, along with the first light emitting elements LD1 connected in parallel to each other in the same direction therebetween.

The second light emitting elements LD2 may be aligned in the same direction between the third electrode EL3 and the fourth electrode EL4. The third electrode EL3 and the fourth electrode EL4 may form the first serial set SET1, along with the second light emitting elements LD2 connected to each other in the same direction therebetween.

The above-described first and second light emitting elements LD1 and LD2 may be provided and/or formed on the first insulating layer INS1.

The first insulating layer INS1 may include an inorganic insulating layer formed of an inorganic material or an organic insulating layer formed of an organic material. In one or more embodiments of the present disclosure, the first insulating layer INS1 may be formed of an inorganic insulating layer that is advantageous (or suitable) to protect the light emitting elements LD from the pixel circuit layer PCL of each pixel PXL. For example, the first insulating layer INS1 may include at least one of metal oxides selected from silicon nitride ($SiN_x$), silicon oxide ($SiO_x$), silicon oxynitride ($SiO_xN_y$), and aluminum oxide ($AlO_x$), but the present disclosure is not limited thereto. According to one or more embodiments, the first insulating layer INS1 may be formed of an organic insulating layer advantageous (or suitable) to planarize the support surface of the light emitting elements LD.

The first insulating layer INS1 may include a first via hole VIH1 exposing a portion of the first electrode EL1, and a second via hole VIH2 exposing a portion of the third electrode EL3. The first insulating layer INS1 may cover the remaining portions, excluding the portion of the first electrode EL1 and the portion of the third electrode EL3 corresponding to the first and second via holes.

A second insulating layer INS2 may be provided and/or formed on the light emitting elements LD. The second insulating layer INS2 partially covers the outer peripheral surface (e.g., the external circumferential surface or surface) of each of the light emitting elements LD by being provided and/or formed on the light emitting elements LD, thereby exposing the opposite ends of each of the light emitting elements LD to the outside.

The second insulating layer INS2 may be formed of a single layer or a multi-layer, and may include an inorganic insulating layer including at least one inorganic material, or an organic insulating layer including at least one organic material. The second insulating layer INS2 may more strongly fix each of the light emitting elements LD. The second insulating layer INS2 may include an inorganic insulating layer that is advantageous (or suitable) to protect the active layer 12 of each of the light emitting elements LD from external oxygen, moisture, and/or the like. However, the present disclosure is not limited thereto. In one or more embodiments, the second insulating layer INS2 may be formed of an organic insulating layer including an organic material, depending on the design conditions of the display device in which the above-described light emitting elements LD are applied as a light source.

After alignment of the light emitting elements LD in each of the first to third emission areas EMA1 to EMA3 of each pixel PXL is completed, the second insulating layer INS2 is formed on the light emitting elements LD, whereby deviation of the light emitting elements LD from the position at which they are aligned may be prevented or reduced. When a gap (or space) is present between the first insulating layer INS1 and the light emitting elements LD before the second insulating layer INS2 is formed, the gap may be filled with the second insulating layer INS2 in the process of forming the second insulating layer INS2. Therefore, the second insulating layer INS2 may be formed of an organic insulating layer that is advantageous (or suitable) to fill the gap between the first insulating layer INS1 and the light emitting elements LD.

The first and second contact electrodes CNE1 and CNE2 and the intermediate electrode CTE may be provided and/or formed on the first to fourth electrodes EL1 to EL4 of each of the first to third areas A1 to A3. The first and second contact electrodes CNE1 and CNE2 and the intermediate electrode CTE may be the fifth conductive layer provided on the second insulating layer INS2.

In the first to third areas A1 to A3, the first and second contact electrodes CNE1 and CNE2 and the intermediate electrode CTE may be components for electrically coupling the first to fourth electrodes EL1 to EL4 to the light emitting elements LD more stably.

The first contact electrode CNE1 may be provided and/or formed on the first electrode EL1. The first contact electrode CNE1 may be connected to the first electrode EL1 by coming into direct contact with the first electrode EL1 through the first via hole VIH1. According to one or more embodiments, when a conductive capping layer is on the first electrode EL1, the first contact electrode CNE1 is on the capping layer, thereby being connected to the first electrode EL1 through the capping layer. The above-described capping layer may enhance the adhesion between the first electrode EL1 and the passivation layer PSV located thereunder, while protecting the first electrode EL1 from a potential defect arising in the process of manufacturing the display device. The capping layer may include a transparent conductive material (or substance) such as indium zinc oxide (IZO) and/or the like.

In one or more embodiments, the first contact electrode CNE1 is provided and/or formed on the second end of each of the first light emitting elements LD1 of each of the first to third emission areas EMA1 to EMA3 of each pixel PXL, thereby being connected to the second end of each of the first light emitting elements LD1. Accordingly, the first electrode EL1 and the second end of each of the first light emitting elements LD1 may be electrically connected to each other through the first contact electrode CNE1.

The second contact electrode CNE2 may be provided and/or formed on the third electrode EL3. The second contact electrode CNE2 may be connected to the third electrode EL3 by coming into direct contact (e.g., physical contact) with the third electrode EL3 through the second via hole VIH2. According to one or more embodiments, when a capping layer is on the third electrode EL3, the second contact electrode CNE2 is on the capping layer, thereby being connected to the third electrode EL3 through the capping layer.

In one or more embodiments, the second contact electrode CNE2 is provided and/or formed on the first end of the each of the second light emitting elements LD2 of each of the first to third emission areas EMA1 to EMA3, thereby being connected to the first end of each of the second light emitting elements LD2. Accordingly, the third electrode EL3 and the first end of each of the second light emitting elements LD2 may be electrically connected to each other through the second contact electrode CNE2.

The first and second contact electrodes CNE1 and CNE2 may be formed of various suitable transparent conductive materials in order to make light, emitted from each of the light emitting elements LD and reflected from the first and third electrodes EL1 and EL3, travel in the image-displaying direction of the display device without (or substantially without) loss. For example, the first and second contact electrodes CNE1 and CNE2 may include at least one of various suitable transparent conductive materials (or substance), such as indium tin oxide (ITO), indium zinc oxide (IZO), zinc oxide (ZnO), indium gallium zinc oxide (IGZO), indium tin zinc oxide (ITZO), and/or the like, and may be formed so as to be substantially transparent or semitransparent, in order to satisfy (e.g., exhibit) a predetermined (or set) transmittance. However, the material of the first and second contact electrodes CNE1 and CNE2 is not limited to the above-described embodiment. According to one or more embodiments, the first and second contact electrodes CNE1 and CNE2 may be alternatively formed of various suitable opaque conductive materials (or substance). The first and second contact electrodes CNE1 and CNE2 may be formed of a single layer or a multi-layer.

In a plan view, each of the first and second contact electrodes CNE1 and CNE2 may have a bar shape extending in the second direction DR2, but the present disclosure is not limited thereto. According to one or more embodiments, the shapes of the first and second contact electrodes CNE1 and CNE2 may be variously suitably changed, as long as they are stably electrically connected to each of the light emitting elements LD. Also, the shape of each of the first and second contact electrodes CNE1 and CNE2 may be variously suitably changed in consideration of the connection relationship with electrodes thereunder.

The intermediate electrode CTE may include a first intermediate electrode CTE1 and a second intermediate electrode CTE2 extending in the second direction DR2.

The first intermediate electrode CTE1 may be provided on the second electrode EL2, and may overlap the second electrode EL2 in a plan view. The first intermediate electrode CTE1 may be electrically insulated from the second electrode EL2 by being on the first insulating layer INS1 on the second electrode EL2. The first intermediate electrode CTE1 may be electrically and/or physically connected to the first light emitting elements LD1 by being on the first end of each of the first light emitting elements LD1 in each of the first to third emission areas EMA1 to EMA3.

The second intermediate electrode CTE2 may be provided on the fourth electrode EL4, and may overlap the fourth electrode EL4 in a plan view. The second intermediate electrode CTE2 may be electrically insulated from the fourth electrode EL4 by being on the first insulating layer INS1 on the fourth electrode EL4. The second intermediate electrode CTE2 may be electrically and/or physically connected to the second light emitting elements LD2 by being on the second end of each of the second light emitting elements LD2 in each of the first to third emission areas EMA1 to EMA3.

The first intermediate electrode CTE1 and the second intermediate electrode CTE2 may be connected to each other by being provided as a single body. The first intermediate electrode CTE1 and the second intermediate electrode CTE2 may be different portions of the intermediate electrode CTE. The first intermediate electrode CTE1 may be substantially the same component as the second intermediate electrode CTE2 described with reference to FIG. 4, and the second intermediate electrode CTE2 may be substantially the same component as the first intermediate electrode CTE1 described with reference to FIG. 4. The intermediate electrode CTE may function as a bridge electrode (or connection electrode) for electrically coupling the second end of each of the second light emitting elements LD2 of the first serial set SET1 to the first end of each of the first light emitting elements LD1 of the second serial set SET2. For example, the intermediate electrode CTE may be the bridge electrode (or connection electrode) for coupling the first serial set SET1 to the second serial set SET2.

In a plan view, the intermediate electrode CTE, including the first intermediate electrode CTE1 and the second intermediate electrode CTE2, may be provided in the shape enclosing at least a portion of the second contact electrode CNE2, while being spaced apart from the second contact electrode CNE2, but the present disclosure is not limited thereto. According to one or more embodiments, the intermediate electrode CTE may be changed to any of various suitable shapes as long as it stably connects the consecutive first serial set SET1 and second serial set SET2 to each other.

The first contact electrode CNE1, the second contact electrode CNE2, and the intermediate electrode CTE may be spaced apart from each other on the plan diagram or cross-sectional diagram.

The intermediate electrode CTE may be formed of various suitable transparent conductive materials in order to make light, emitted from each of the light emitting elements LD and reflected from the first to fourth electrodes EL1 to EL4, travel in the image-displaying direction of the display device without loss.

The intermediate electrode CTE may be formed through the same process as the first and second contact electrodes CNE1 and CNE2, by being provided on the same layer as the first and second contact electrodes CNE1 and CNE2. For example, the intermediate electrode CTE and the first and second contact electrodes CNE1 and CNE2 may be provided and/or formed on the second insulating layer INS2. However, the present disclosure is not limited thereto, and according to one or more embodiments, the intermediate electrode CTE may be provided on the layer that is different from the layer on which the first and second contact electrodes CNE1 and CNE2 are provided, and may be formed through a process that is different from the process in which the first and second contact electrodes CNE1 and CNE2 are formed.

The third insulating layer INS3 may be provided and/or formed on the first contact electrode CNE1, the second contact electrode CNE2, and the intermediate electrode CTE. The third insulating layer INS3 may be an inorganic insulating layer including an inorganic material, or an organic insulating layer including an organic material. For example, the third insulating layer INS3 may have a structure in which at least one inorganic insulating layer and at least one organic insulating layer are alternately stacked. The third insulating layer INS3 entirely covers the display element layer DPL, thereby preventing or reducing external water, moisture, and/or the like from entering the display element layer DPL including the light emitting elements LD.

When driving current flows from the first power line PL1 to the second power line PL2 by the first transistor T1 of each of the first to third sub-pixels SPXL1 to SPXL3, the driving current may flow into the light emitting unit EMU of the corresponding sub-pixel through the second contact hole CNT2 of the corresponding sub-pixel.

For example, driving current is supplied to the third electrode EL3 of the third area A3 through the second contact hole CNT2 of the first sub-pixel SPXL1, and the driving current flows to the intermediate electrode CTE via the second light emitting elements LD2 through the second contact electrode CNE2 coming into direct contact (e.g., physical contact) with (or connected to) the third electrode EL3. Accordingly, the second light emitting elements LD2 may emit light with luminance corresponding to the current distributed to the respective second light emitting elements LD2 in the first serial set SET1 of the first sub-pixel SPXL1. The driving current flowing in the intermediate electrode CTE flows to the first contact electrode CNE1 via the intermediate electrode CTE and the first light emitting elements LD1. Accordingly, the first light emitting elements LD1 may emit light with luminance corresponding to the current distributed to the respective first light emitting elements LD1 in the second serial set SET2 of the first sub-pixel SPXL1.

In one or more embodiments, driving current is supplied to the third electrode EL3 of the first area A1 through the second contact hole CNT2 of the second sub-pixel SPXL2, and the driving current flows to the intermediate electrode CTE via the second light emitting elements LD2 through the second contact electrode CNE2 connected to the third electrode EL3. Accordingly, the second light emitting elements LD2 may emit light with luminance corresponding to the current distributed to the respective second light emitting elements LD2 in the first serial set SET1 of the second sub-pixel SPXL2. The driving current flowing in the intermediate electrode CTE flows to the first contact electrode CNE1 via the intermediate electrode CTE and the first light emitting elements LD1. Accordingly, the first light emitting elements LD1 may emit light with luminance corresponding to the current distributed to the respective first light emitting elements LD1 in the second serial set SET2 of the second sub-pixel SPXL2.

In one or more embodiments, driving current is supplied to the third electrode EL3 of the second area A2 through the second contact hole CNT2 of the third sub-pixel SPXL3, and the driving current flows to the intermediate electrode CTE via the second light emitting elements LD2 through the second contact electrode CNE2 connected to the third electrode EL3. Accordingly, the second light emitting elements LD2 may emit light with luminance corresponding to the current distributed to the respective second light emitting elements LD2 in the first serial set SET1 of the third sub-pixel SPXL3. The driving current flowing in the intermediate electrode CTE flows to the first contact electrode CNE1 via the intermediate electrode CTE and the first light emitting elements LD1. Accordingly, the first light emitting elements LD1 may emit light with luminance corresponding to the current distributed to the respective first light emitting elements LD1 in the second serial set SET2 of the third sub-pixel SPXL3.

Based on the above-described method, the driving current of each of the first to third sub-pixels SPXL1 to SPXL3 may flow so as to sequentially pass through the second light emitting elements LD2 of the first serial set SET1 and the first light emitting elements LD1 of the second serial set SET2. Accordingly, each pixel PXL may emit light with luminance corresponding to a data signal supplied during each frame period.

Above each pixel PXL, a light blocking pattern LBP and a color filter CF may be located.

The light blocking pattern LBP may be provided so as to correspond to the bank BNK, while enclosing the light emitting elements LD in the non-emission area EMA, which is the periphery of the first to third emission areas EMA1 to EMA3. The light blocking pattern LBP may be a black matrix pattern. The light blocking pattern LBP may be the light blocking pattern LBP described with reference to FIG. 5.

In one or more embodiments of the present disclosure, the light blocking pattern LBP may include a first opening OPN1 corresponding to the first emission area EMA1, a second opening OPN2 corresponding to the second emission area EMA2, and a third opening OPN3 corresponding to the third emission area EMA3, as illustrated in FIG. 8.

The width W1 of the first opening OPN1 in the first direction DR1, the width W2 of the second opening OPN2 in the first direction DR1, and the width W3 of the third opening OPN3 in the first direction DR1 may be the same as each other, but the present disclosure is not limited thereto. According to one or more embodiments, the width W1 of the first opening OPN1 in the first direction DR1, the width W2 of the second opening OPN2 in the first direction DR1, and the width W3 of the third opening OPN3 in the first direction DR1 may be different from each other. According to one or more embodiments, among the width W1 of the first opening OPN1 in the first direction DR1, the width W2 of the second opening OPN2 in the first direction DR1, and the width W3 of the third opening OPN3 in the first direction DR1, the width of at least one opening in the first direction DR1 may be different from the widths of the two remaining openings in the first direction DR1, or vice versa.

The length h1 of the first opening OPN1 in the second direction DR2 (hereinafter, referred to as a 'first length'), the length h2 of the second opening OPN2 in the second direction DR2 (hereinafter, referred to as a 'second length'), and the length h3 of the third opening OPN3 in the second direction DR2 (hereinafter, referred to as a 'third length') may be different from each other (see e.g., FIG. 8). For example, the first length h1 of the first opening OPN1 may be formed so as to be longer than the second length h2 of the second opening OPN2 and the third length h3 of the third opening OPN3. The second length h2 of the second opening OPN2 may be formed so as to be shorter than the first length h1 of the first opening OPN1 and longer than the third length h3 of the third opening OPN3. The third length h3 of the third opening OPN3 may be formed so as to be shorter than the length of each of the first and second openings OPN1 and OPN2. That is, the first length h1 of the first opening OPN1 may be formed so as to be longest, and the third length h3 of the third opening OPN3 may be formed so as to be shortest.

As described above, because the first to third openings OPN1 to OPN3 are formed such that the lengths thereof in the second direction DR2 are different from each other, the first to third openings OPN1 to OPN3 may have different sizes. For example, the first opening OPN1 may have the largest size, and the third opening OPN3 may have the smallest size. However, the present disclosure is not limited thereto, and the size of each of the first to third openings OPN1 to OPN3 may be adjusted depending on the components located thereunder according to one or more embodiments.

The color filter CF may include a first color filter pattern CF1, a second color filter pattern CF2, and a third color filter pattern CF3.

The first color filter pattern CF1 may correspond to the first opening OPN1 of the light blocking pattern LBP, and may be located above the display element layer DPL of the first emission area EMA1 exposed by the first opening OPN1.

The second color filter pattern CF2 may correspond to the second opening OPN2 of the light blocking pattern LBP, and may be located above the display element layer DPL of the second emission area EMA2 exposed by the second opening OPN2.

The third color filter pattern CF3 may correspond to the third opening OPN3 of the light blocking pattern LBP, and may be located above the display element layer DPL of the third emission area EMA3 exposed by the third opening OPN3.

In one or more embodiments of the present disclosure, the first color filter pattern CF1 may be a red color filter to selectively transmit a predetermined (or set) color of light (for example, red light), the second color filter pattern CF2 may be a green color filter to selectively transmit a predetermined (or set) color of light (for example, green light), and the third color filter pattern CF3 may be a blue color filter to selectively transmit a predetermined (or set) color of light (for example, blue light).

According to one or more embodiments, the color filter CF may be provided on a color conversion layer including color conversion particles for changing light emitted from the light emitting elements LD to a predetermined (or set) color. The color conversion layer will be described in more detail hereinbelow with reference to FIGS. 13 to 17.

As described above, when the second sub-pixel SPXL2 is a red pixel, when the first sub-pixel SPXL1 is a blue pixel, and when the third sub-pixel SPXL3 is a green pixel, the first color filter pattern CF1, which is a red color filter, may be located so as to correspond to the first opening OPN1, the second color filter pattern CF2, which is a green color filter, may be located so as to correspond to the second opening OPN2, and the third color filter pattern CF3, which is a blue color filter, may be located so as to correspond to the third opening OPN3.

In a related display device, when the light emitting element LD emits blue-colored light, and when the blue-colored light passes through the red color filter, because the red color filter absorbs the blue light in a short wavelength area, the blue color is mixed in the red gamut, which causes color mixture. Due to the color mixture, the area of the pure red light finally passing through the red color filter may become narrow. Accordingly, the red color filter is designed so as to have a relatively larger size than the green color filter and the blue color filter, whereby the amount (or strength) of light from the red color filter may become equal to the amount (or strength) of light from each of the green and blue color filters. In this case, the first color filter pattern CF1, which is a red color filter, may be located so as to correspond to the first opening OPN1 of the light blocking pattern LBP, which has a relatively large size.

As described above, the first color filter pattern CF1 may be provided in the first area A1 of each pixel PXL so as to correspond to the first opening OPN1 of the light blocking pattern LBP, which has a relatively large size. The third color filter pattern CF3 may be provided in the third area A3 of each pixel PXL so as to correspond to the third opening OPN3 of the light blocking pattern LBP, which has a relatively small size. The second color filter pattern CF2 may be provided in the second area A2 of each pixel PXL so as to correspond to the second opening OPN2 of the light blocking pattern LBP.

In one or more embodiments, the storage capacitors of the first to third sub-pixels SPXL1 to SPXL3 may be convergently (e.g., collectively) in the first area A1 of each pixel PXL. For example, the first storage capacitor Cst1 of the first sub-pixel SPXL1, the second storage capacitor Cst2 of the second sub-pixel SPXL2, and the third storage capacitor Cst3 of the third sub-pixel SPXL3 may be in the first area A1. As described above, the first storage capacitor Cst1 may be electrically connected to the third electrode EL3 located in the third area A3 of each pixel PXL, the second storage capacitor Cst2 may be electrically connected to the third electrode EL3 located in the first area A1 of the corresponding pixel PXL, and the third storage capacitor Cst3 may be electrically connected to the third electrode EL3 located in the second area A2 of the corresponding pixel PXL.

In this case, when the light emitting elements LD are aligned in each of the first to third areas A1 to A3 of each pixel PXL, a predetermined (or set) alignment signal (or alignment voltage) may be applied to the first to third storage capacitors Cst1 to Cst3 in the first area A1. When the predetermined (or set) alignment signal is applied to the first to third storage capacitors Cst1 to Cst3, an electric field may be formed between the first to third storage capacitors Cst1 to Cst3 and the first to fourth electrodes EL1 to EL4 in the first area A1. Here, when light emitting elements LD are supplied to (or put into) each of the first to third areas A1 to A3 using an inkjet printing method and/or the like, at least some of the light emitting elements LD may be aligned in the area at which they are not targeted (e.g., an undesired area) by deviating from the target area (e.g., the area in which they are convergently aligned). For example, at least some of the light emitting elements LD may be located in the upper portion of the first emission area EMA1 adjacent to the bank BNK (e.g., in the upper portion of the first storage capacitor Cst1) and/or in the lower portion thereof (e.g., in the lower portion of the third storage capacitor Cst3).

The relatively large first opening OPN1 of the light blocking pattern LBP may be located above the above-described first area A1, and the first color filter pattern CF1, which is a red color filter, may correspond to the first opening OPN1. Here, the first color filter pattern CF1 may have a size that is sufficient to cover the first to third storage capacitors Cst1 to Cst3 located in the first area A1. Because the relatively large first color filter pattern CF1 is located above the first area A1, at least some light emitting elements LD aligned in the undesired area in the first area A1 may be covered by the first color filter pattern CF1. Accordingly, the at least some light emitting elements LD are electrically connected to the first to fourth electrodes EL1 to EL4, thereby being used as effective (e.g., forward biased) light sources that emit light. Consequently, even though at least some of the light emitting elements LD are aligned in the undesired area by deviating from a target area because the first to third storage capacitors Cst1 to Cst3 are convergently in the first area A1, because the relatively large first color filter pattern CF1 is above the first area A1 so as to correspond to the relatively large first opening OPN1 of the light blocking pattern LBP, the corresponding light emitting elements LD may be used as effective (e.g., forward biased)

light sources. Accordingly, the loss of the light emitting elements LD is minimized or reduced, and some light emitting elements LD deviating from the alignment position are used as effective (e.g., forward biased) light sources. Accordingly, the number of effective (e.g., forward biased) light sources provided for each unit area in the first area A1 is increased, whereby light output efficiency may be improved.

If the third color filter pattern CF3, which is a blue color filter having the smallest size, is above the first area A1, some light emitting elements LD deviating from the alignment position in the first area A1 may be covered by the light blocking pattern LBP. In this case, the corresponding light emitting elements LD become ineffective light (e.g., reverse biased) sources, and the number of effective (e.g., forward biased) light sources provided for each unit area of the first area A1 is reduced. Accordingly, the loss of light emitting elements LD may be caused.

Therefore, in the present disclosure, the first color filter pattern CF1, which is a red color filter having a relatively large size, is above the first area A1 so as to increase the number of effective (e.g., forward biased) light sources in the first area A1, whereby the loss of the light emitting elements LD may be minimized or reduced.

Figure 13:
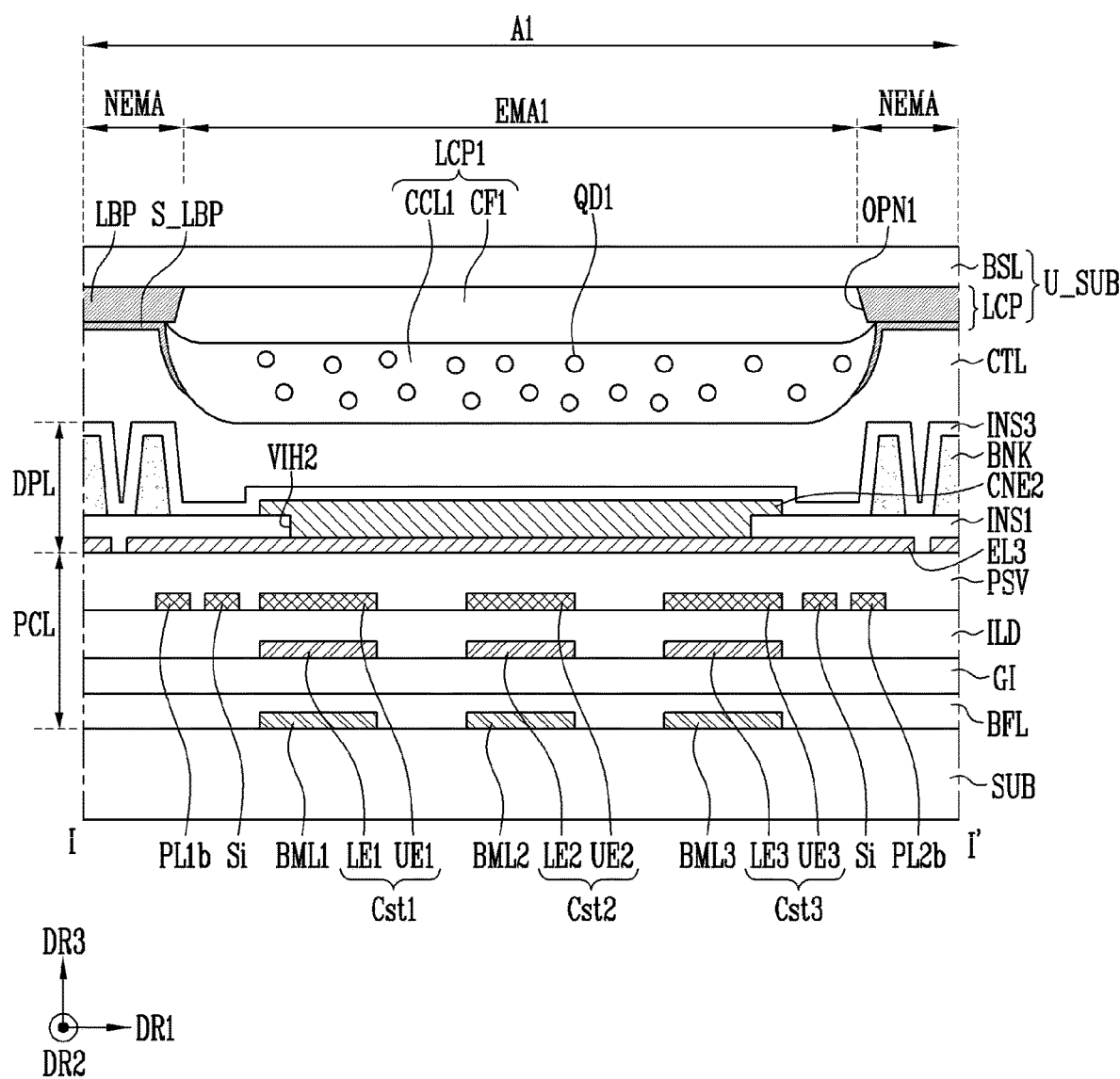
FIG. 13 and FIG. 14 are schematic cross-sectional diagrams taken along the line I-I' in FIG. 5.
Figure 14:
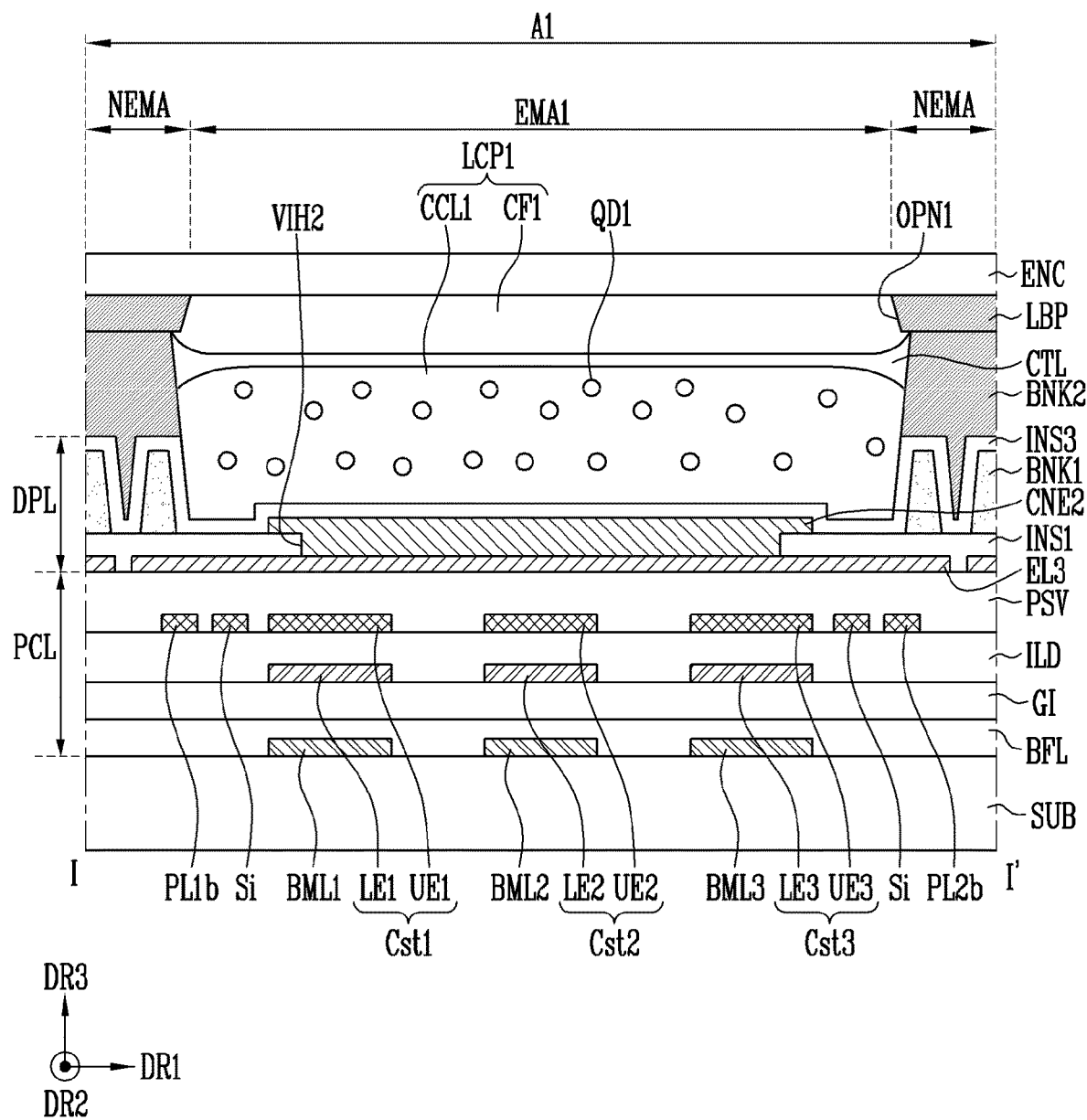
Figure 15:
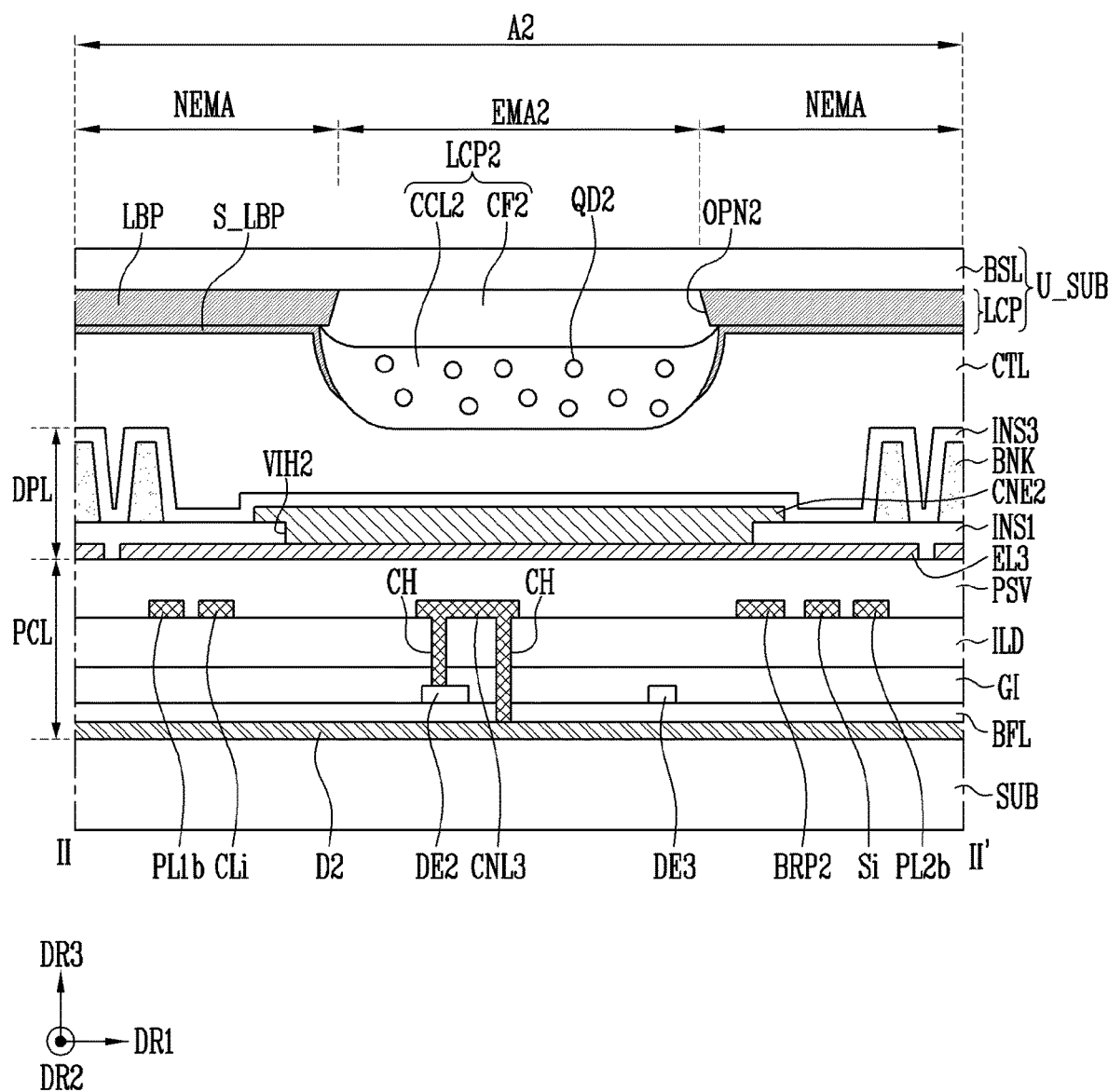
FIG. 15 is a schematic cross-sectional diagram taken along the line II-II' in FIG. 5.
Figure 16:
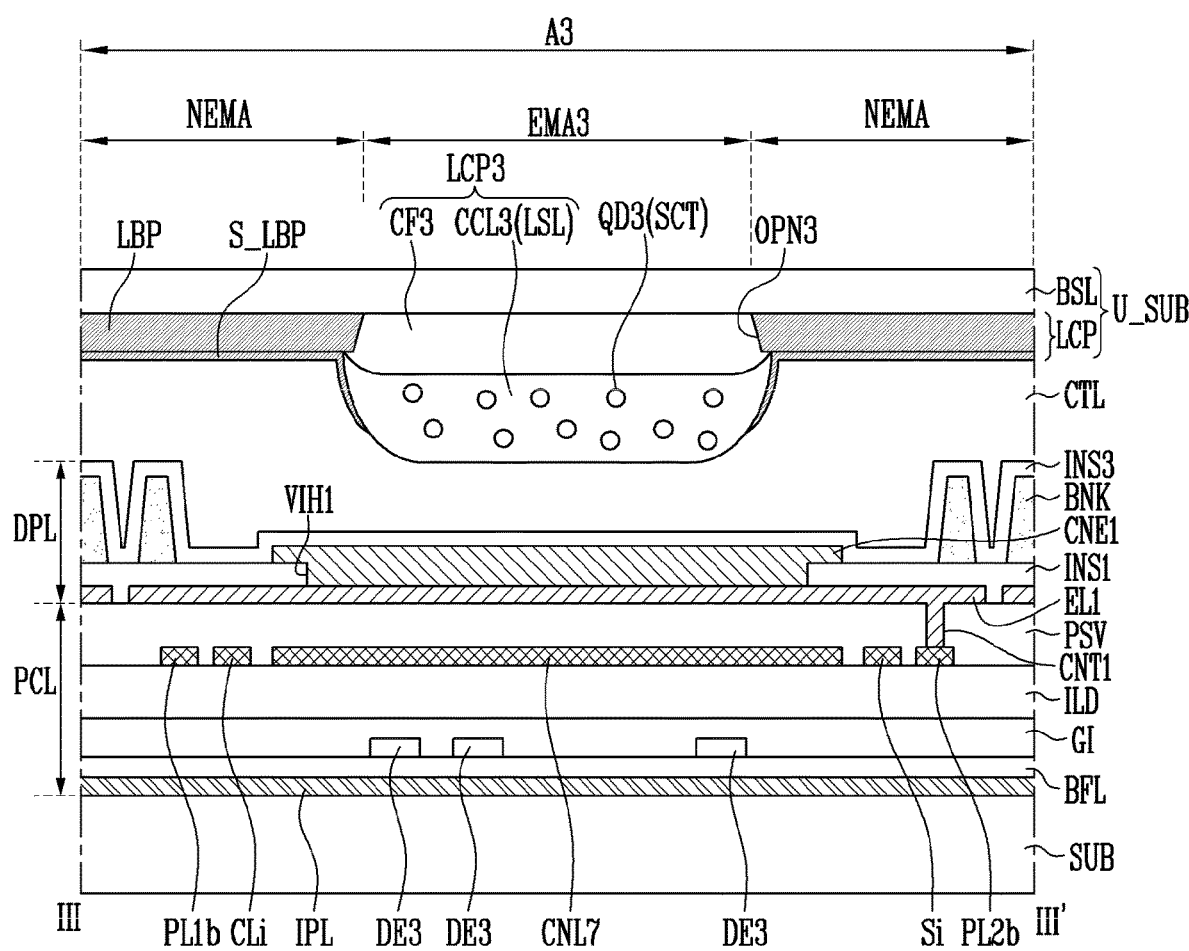
FIG. 16 is a schematic cross-sectional diagram taken along the line III-Ill' in FIG. 5.
Figure 17:
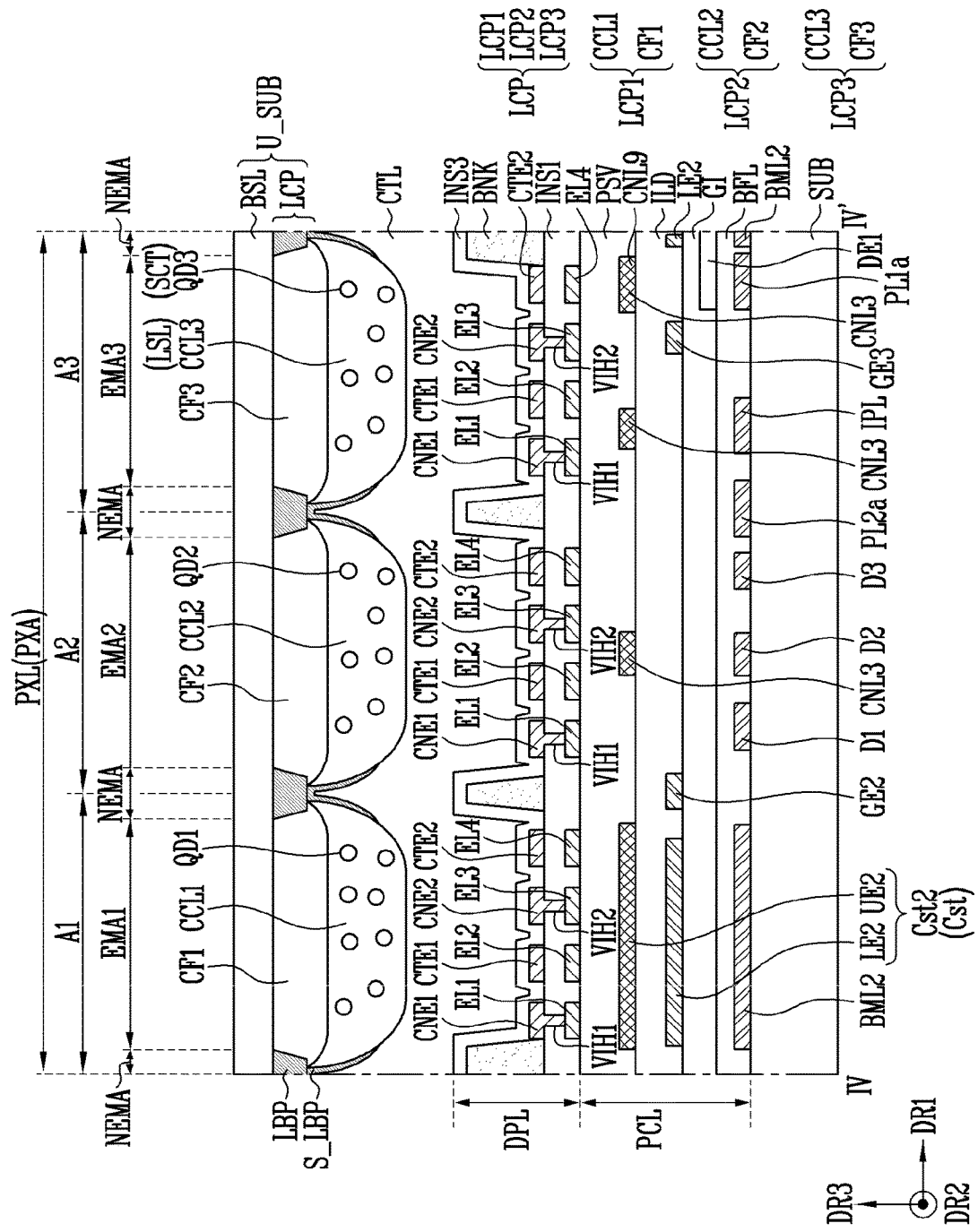
FIG. 17 is a schematic cross-sectional diagram taken along the line IV-IV' in FIG. 5.

FIG. 13 and FIG. 14 are schematic cross-sectional diagrams taken along the line I-I' of FIG. 5. FIG. 15 is a schematic cross-sectional diagram taken along the line II-II' of FIG. 5. FIG. 16 is a schematic cross-sectional diagram taken along the line III-III' of FIG. 5, and FIG. 17 is a schematic cross-sectional diagram taken along the line IV-IV' of FIG. 5.

For reference, FIGS. 13 to 17 illustrate embodiments of a display device including color conversion particles. For example, the display device according to the present disclosure may selectively include color conversion particles above each pixel PXL.

In FIGS. 13 to 17, a cross-section of the display device is briefly illustrated with focus on a pixel area PXA in which a single pixel PXL including the first to third sub-pixels SPXL1 to SPXL3 illustrated in FIG. 5 is disposed.

In regard to the display device of FIGS. 13 to 17, a description will be made with focus on the point that is different from the above-described embodiment in order to avoid a repeated description. The part that is not specially described in one or more embodiments of the present disclosure follows the above-described embodiment. Also, the same reference numeral denotes the same component, and similar reference numerals denote similar components.

Referring to FIGS. 1 to 17, the display device according to one or more embodiments of the present disclosure may include a substrate SUB, a plurality of pixels PXL provided on the substrate SUB, and an upper substrate U_SUB located above each of the pixels PXL.

Each of the pixels PXL includes first to third sub-pixels SPXL1 to SPXL3, and may be divided into first to third sub-pixel areas SPXA1 to SPXA3 depending on the area in which the pixel circuit PXC of the corresponding sub-pixel is located. In one or more embodiments, the pixel PXL may be divided into first to third areas A1 to A3 depending on the area in which light emitting elements LD are located.

The upper substrate U_SUB may be on the respective pixels PXL so as to cover a display area DA in which the pixels PXL are disposed. The upper substrate U_SUB may form an encapsulation substrate (or a thin-film encapsulation layer) and/or a window member. An intermediate layer CTL may be provided between the upper substrate U_SUB and each of the pixels PXL. The intermediate layer CTL may be a transparent cohesion layer (or adhesive layer) for enforcing adhesion between each of the pixels PXL and the upper substrate U_SUB, e.g., an optically clear adhesive layer, but the present disclosure is not limited thereto. According to one or more embodiments, the intermediate layer CTL may be an air layer. Also, according to one or more embodiments, the intermediate layer CTL may be formed of a predetermined (or set) filler having a relatively low refractive index, in order to enable light emitted from light emitting elements LD to travel in the upward direction relative to the pixels PXL (e.g., the image-displaying direction of the display device) without loss.

The upper substrate U_SUB may include a base layer BSL and a light conversion pattern layer LCP.

The base layer BSL may be a rigid substrate or a flexible substrate, and the material or property thereof is not limited to a specific material or property. The base layer BSL may be formed of the same material as the substrate SUB described with reference to FIGS. 6 to 12, or a material different from that of the substrate SUB described with reference to FIGS. 6 to 12.

The light conversion pattern layer LCP may be on one surface of the base layer BSL, so as to face each of the pixels PXL. The light conversion pattern layer LCP may include a color conversion layer and a color filter pattern, corresponding to a predetermined (or set) color.

The light conversion pattern layer LCP may include a first light conversion pattern layer LCP1 facing the first area A1 of each of the pixels PXL, a second light conversion pattern layer LCP2 facing the second area A2 of the pixel PXL, and a third light conversion pattern layer LCP3 facing the third area A3 of the pixel PXL.

According to one or more embodiments, at least some of the first to third light conversion pattern layers LCP1 to LCP3 may include a color conversion layer and/or a color filter pattern corresponding to a predetermined (or set) color. For example, the first light conversion pattern layer LCP1 may include a first color conversion layer CCL1, including first color conversion particles QD1 corresponding to a first color, and a first color filter pattern CF1 to selectively transmit the first color of light. The second light conversion pattern layer LCP2 may include a second color conversion layer CCL2, including second color conversion particles QD2 corresponding to a second color, and a second color filter pattern CF2 to selectively transmit the second color of light. The third light conversion pattern layer LCP3 may include a third color conversion layer CCL3, including third color conversion particles QD3 corresponding to a third color, and a third color filter pattern CF3 to selectively transmit the third color of light. According to one or more embodiments, the third light conversion pattern layer LCP3 may include a light-scattering layer LSL including light-scattering particles SCT, in place of the third color conversion layer CCL3. For example, when light emitting elements LD emit blue-colored light, the third light conversion pattern layer LCP3 may include a light-scattering layer LSL including light-scattering particles SCT.

The light emitting elements LD aligned in the emission area of each of the first to third sub-pixels SPXL1 to SPXL3 may emit the same color of light. In one or more embodiments, a color conversion layer may be above at least some of the first to third sub-pixels SPXL1 to SPXL3. Accordingly, the above-described display device may display a full-color image.

The first color conversion layer CCL1 may be on one surface of the base layer BSL, so as to face a display element layer DPL including the light emitting elements LD of the first area A1, and may include first color conversion particles QD1 configured to convert a color of light emitted from the light emitting elements LD to the first color of light. Here, because the light emitting elements LD of the first area A1 emit light by being electrically connected to the pixel circuit PXC of the second sub-pixel SPXL2, when the second sub-pixel SPXL2 is a red pixel, the first color conversion particles QD1 of the first color conversion layer CCL1 facing the first area A1 may be red quantum dots.

The first color filter pattern CF1 may be on the first color conversion layer CCL1. The first color filter pattern CF1 may be the first color filter pattern CF1 described with reference to FIGS. 5 to 12. For example, the first color filter pattern CF1 may be a red color filter.

The second color conversion layer CCL2 may be on one surface of the base layer BSL, so as to face the display element layer DPL including the light emitting elements LD of the second area A2, and may include second color conversion particles QD2 configured to convert a color of light emitted from the light emitting elements LD to the second color of light. Here, because the light emitting elements LD of the second area A2 emit light by being electrically connected to the pixel circuit PXC of the third sub-pixel SPXL3, when the third sub-pixel SPXL3 is a green pixel, the second color conversion particles QD2 of the second color conversion layer CCL2 facing the second area A2 may be green quantum dots.

The second color filter pattern CF2 may be on the second color conversion layer CCL2. The second color filter pattern CF2 may be the second color filter pattern CF2 described with reference to FIGS. 5 to 12. For example, the second color filter pattern CF2 may be a green color filter.

The third color conversion layer CCL3 may be on one surface of the base layer BSL, so as to face the display element layer DPL including the light emitting elements LD of the third area A3, and may include third color conversion particles QD3 configured to convert a color of light emitted from the light emitting elements LD to the third color of light. Here, because the light emitting elements LD of the third area A3 emit light by being electrically connected to the pixel circuit PXC of the first sub-pixel SPXL1, when the first sub-pixel SPXL1 is a blue pixel, the third color conversion particles QD3 of the third color conversion layer CCL3 facing the third area A3 may be blue quantum dots. According to one or more embodiments, in the case where the light emitting elements LD of the third area A3 emit blue-colored light, a light-scattering layer LSL including light-scattering particles SCT may be on one surface of the base layer BSL, so as to face the display element layer DPL including the light emitting elements LD.

The third color filter pattern CF3 may be on the third color conversion layer CCL3 or the light-scattering layer LSL. The third color filter pattern CF3 may be the third color filter pattern CF3 described with reference to FIGS. 5 to 12. For example, the third color filter pattern CF3 may be a blue color filter.

A light blocking pattern LBP may be between each of the first to third color filter patterns CF1 to CF3 and the color filter pattern adjacent thereto. The light blocking pattern LBP may be provided above each pixel PXL, so as to cover the area excluding the first to third emission areas EMA1 to EMA3 of the corresponding pixel PXL. The light blocking pattern LBP may be the light blocking pattern LBP described with reference to FIGS. 5 to 12.

The light blocking pattern LBP may be provided on one surface of the base layer BSL, so as to face the bank BNK located in the non-emission area NEMA of each pixel PXL, and may overlap the edge of each of the first to third color filter patterns CF1 to CF3. The light blocking pattern LBP may include at least one black matrix material (e.g., at least one suitable light-blocking material) among various black matrix materials, and/or a color filter material having a specific (or set) color. In one or more embodiments, the light blocking pattern LBP may be formed of the same material as the bank BNK, but is not limited thereto. For example, the light blocking pattern LBP and the bank BNK may include the same material or different materials. According to one or more embodiments, a sub light blocking pattern S_LBP may be on the light blocking pattern LBP. The sub light blocking pattern S_LBP may include the same material as the light blocking pattern LBP. The sub light blocking pattern S_LBP may be provided on one surface of the light blocking pattern LBP so as to be located between the adjacent color conversion layers CCL.

The light blocking pattern LBP may be open in the area corresponding to the emission area of each of the first to third areas A1 to A3. For example, the light blocking pattern LBP may include a first opening OPN1 that is open in the area corresponding to the first emission area EMA1 of the first area A1, a second opening OPN2 that is open in the area corresponding to the second emission area EMA2 of the second area A2, and a third opening OPN3 that is open in the area corresponding to the third emission area EMA3 of the third area A3. The first opening OPN1 may be formed so as to have a relatively larger size than the second and third openings OPN2 and OPN3.

The first color filter pattern CF1 may correspond to the first opening OPN1, the second color filter pattern CF2 may correspond to the second opening OPN2, and the third color filter pattern CF3 may correspond to the third opening OPN3. Because the first color filter pattern CF1 is located so as to correspond to the first opening OPN1 having a relatively large size, the first color filter pattern CF1 may have a relatively larger size than the second and third color filter patterns CF2 and CF3.

The first emission area EMA1, in which light is emitted in the first area A1, may be finally set (e.g., designated) depending on the first color filter pattern CF1 and the light blocking pattern LBP located in the vicinity thereof. Here, the first emission area EMA1 may be the emission area of the second sub-pixel SPXL2.

The second emission area EMA2, in which light is emitted in the second area A2, may be finally set (e.g., designated) depending on the second color filter pattern CF2 and the light blocking pattern LBP located in the vicinity thereof. Here, the second emission area EMA2 may be the emission area of the third sub-pixel SPXL3.

The third emission area EMA3, in which light is emitted in the third area A3, may be finally set (e.g., designated) depending on the third color filter pattern CF3 and the light blocking pattern LBP located in the vicinity thereof. Here, the third emission area EMA3 may be the emission area of the first sub-pixel SPXL1.

As described above, because the first color filter pattern CF1 is formed so as to have a relatively larger size than the second and third color filter patterns CF2 and CF3, the area (or size) of the first emission area EMA1 may be larger than the area (or size) of each of the second and third emission areas EMA2 and EMA3. Even when at least some of the light emitting elements LD are aligned in the undesired area by deviating from the target area because some components (e.g., the storage capacitor) of the pixel circuit PXC of each of the first to third sub-pixels SPXL1 to SPXL3 are in the first area A1, the first color filter pattern CF1 covers the corresponding light emitting elements LD, whereby the corresponding light emitting elements LD may still be used as effective (e.g., forward biased) light sources. Accordingly, in the above-described embodiment, the number of effective (e.g., forward biased) light sources is increased, while minimizing or reducing the loss of the light emitting elements LD in the first area A1, whereby light output efficiency may be improved.

While the upper substrate U_SUB including the base layer BSL, the light blocking pattern LBP, and the light conversion pattern layer LCP is described as being provided above each pixel PXL in the above-described embodiment, the present disclosure is not limited thereto. According to one or more embodiments, as illustrated in FIG. 14, the light conversion pattern layer LCP, including the first light conversion pattern layer LCP1 and the light blocking pattern LBP, may be formed on the substrate SUB on which each pixel PXL is provided. For example, in order to cover the light emitting elements LD located in each of the first to third areas A1 to A3 of each pixel PXL, the light blocking pattern LBP and the light conversion pattern layer LCP may be alternatingly formed on the substrate SUB, on which the pixel PXL is provided. Here, the intermediate layer CTL may be between the first color conversion layer CCL1 and the first color filter pattern CF1. The intermediate layer CTL may be at least one insulating layer. In this case, a second bank BNK2 may be provided in the non-emission area NEMA of the pixel PXL. The second bank BNK2 is provided on the first bank BNK1 located on the first insulating layer INS1 of the display element layer DPL of the pixel PXL, thereby forming a dam structure along with the first bank BNK1. The second bank BNK2 may overlap the first bank BNK1 in a cross-sectional view. Here, the first bank BNK1 may be the bank BNK described with reference to FIGS. 5 to 12. Also, in this case, an encapsulation layer ENC may be provided on the light blocking pattern LBP and the color conversion pattern layer LCP.

A display device according to one or more embodiments of the present disclosure may include first to third emission areas separated along a first direction, first to third capacitors corresponding to one of the first to third emission areas, and color filter patterns provided on the respective first to third emission areas. By disposing a red color filter having a relatively large size in the emission area in which the first to third capacitors are convergently disposed, the number of light emitting elements covered by a light blocking pattern is minimized (or reduced), whereby the number of light emitting elements that can be used as effective (e.g., forward biased) light sources is increased, and the light output efficiency of the display device may be improved.

Effects according to one or more embodiments of the present disclosure are not limited by the above-described embodiments, and various effects are included in the present disclosure.

Although the example embodiments of the present disclosure have been disclosed for illustrative purposes, those skilled in the art will appreciate that various modifications, additions and substitutions are possible, without departing from the scope and spirit of the disclosure as disclosed in the accompanying claims and their equivalents.

Therefore, the technical scope of the present disclosure should be defined by the technical spirit of the claims and their equivalents, rather than the detailed description.

What is claimed is:
1. A display device, comprising:
a substrate;
at least one pixel divided along a first direction on the substrate, the at least one pixel comprising a first emission area, a second emission area, and a third emission area, each of the first emission area, second emission area, and third emission area comprising a plurality of light emitting elements;
a light blocking pattern corresponding to an area between the first emission area, the second emission area, and the third emission area; and
a color filter layer comprising a first color filter pattern on the first emission area, a second color filter pattern on the second emission area, and a third color filter pattern on the third emission area,
wherein the pixel comprises a first storage capacitor, a second storage capacitor, and a third storage capacitor on the substrate and arranged with each other along a second direction that is different from the first direction, the first storage capacitor, the second storage capacitor, and the third storage capacitor respectively corresponding to one of the first color filter pattern, the second color filter pattern, and the third color filter pattern.

2. The display device according to claim 1, wherein:
the first color filter pattern is a red color filter,
the second color filter pattern is a green color filter, and
the third color filter pattern is a blue color filter.

3. A display device, comprising:
a substrate;
at least one pixel divided along a first direction on the substrate, the at least one pixel comprising a first emission area, a second emission area, and a third emission area, each of the first emission area, second emission area, and third emission area comprising a plurality of light emitting elements;
a light blocking pattern corresponding to an area between the first emission area, the second emission area, and the third emission area;
a color filter layer comprising a first color filter pattern on the first emission area, a second color filter pattern on the second emission area, and a third color filter pattern on the third emission area, the first color filter pattern being a red color filter, the second color filter pattern being a green color filter, and the third color filter pattern being a blue color filter,
a buffer layer on the substrate; and
a first insulating layer, a second insulating layer, and a third insulating layer sequentially on the buffer layer,
wherein the pixel comprises a first storage capacitor, a second storage capacitor, and a third storage capacitor on the substrate, the first storage capacitor, the second storage capacitor, and the third storage capacitor respectively corresponding to one of the first color filter pattern, the second color filter pattern, and the third color filter pattern, and
wherein each of the first storage capacitor, the second storage capacitor, and the third storage capacitor comprises a lower electrode on the first insulating layer, and an upper electrode on the second insulating layer and overlapping the lower electrode.

4. The display device according to claim 3, wherein the pixel comprises:
a first sub-pixel comprising the first storage capacitor and at least one transistor electrically connected to the first storage capacitor;
a second sub-pixel comprising the second storage capacitor and at least one transistor electrically connected to the second storage capacitor; and a third sub-pixel comprising the third storage capacitor and at least one transistor electrically connected to the third storage capacitor.

5. The display device according to claim 4, wherein a pixel area comprising the pixel is divided into a first sub-pixel area comprising the first sub-pixel, a second sub-pixel area comprising the second sub-pixel, and a third sub-pixel area comprising the third sub-pixel, along a second direction.

6. The display device according to claim 5, wherein:
the first storage capacitor corresponds to the first sub-pixel area,
the second storage capacitor corresponds to the second sub-pixel area, and
the third storage capacitor corresponds to the third sub-pixel area.

7. The display device according to claim 6, wherein:
the pixel further comprises:
 a first data line, a second data line, a third data line, and a 1-1-th power line on the substrate, extending in the second direction, and corresponding to the second color filter pattern; and
 a 2-1-th power line and an initialization power line on the substrate, extending in the second direction, and corresponding to the third color filter pattern, and
wherein the first data line, the second data line, the third data line, the 1-1-th power line, the 2-1-th power line, and the initialization power line are on the buffer layer.

8. The display device according to claim 7, wherein:
the pixel further comprises a bottom metal layer overlapping each of the first storage capacitor, the second storage capacitor, and the third storage capacitor, and
the bottom metal layer is on an identical layer as the first data line, the second data line, the third data line, the 1-1-th power line, the 2-1-th power line, and the initialization power line.

9. The display device according to claim 8, wherein:
the pixel further comprises a 1-2-th power line and a 2-2-th power line extending in the first direction and spaced apart from each other on the second insulating layer, and
the 1-2-th power line is electrically connected to the 1-1-th power line, and the 2-2-th power line is electrically connected to the 2-1-th power line.

10. The display device according to claim 9, wherein:
the pixel further comprises a first electrode, a second electrode, a third electrode, and a fourth electrode on the third insulating layer and corresponding to each of the first emission area, the second emission area, and the third emission area, and
the first electrode, the second electrode, the third electrode, and the fourth electrode are spaced apart from each other in the first direction.

11. The display device according to claim 10, wherein:
in each of the first emission area, the second emission area, and the third emission area, the first electrode is electrically connected to the 2-2-th power line,
in the first emission area, the third electrode is electrically connected to the second storage capacitor,
in the second emission area, the third electrode is electrically connected to the third storage capacitor, and
in the third emission area, the third electrode is electrically connected to the first storage capacitor.

12. The display device according to claim 11, wherein the plurality of light emitting elements comprise:

a plurality of first light emitting elements between the first electrode and the second electrode, and electrically connected to the first electrode and the second electrode; and
a plurality of second light emitting elements between the third electrode and the fourth electrode, and electrically connected to the third electrode and the fourth electrode.

13. The display device according to claim 12, wherein the pixel further comprises:
a first contact electrode on the first electrode to electrically connect the first electrode to a first end of each of the plurality of first light emitting elements;
an intermediate electrode on the respective second and fourth electrodes to electrically connect a second end of each of the plurality of first light emitting elements to a first end of each of the plurality of second light emitting elements; and
a second contact electrode on the third electrode to electrically connect the third electrode to a second end of each of the plurality of second light emitting elements.

14. The display device according to claim 13, wherein:
the first contact electrode, the intermediate electrode, and the second contact electrode are spaced apart from each other.

15. The display device according to claim 13, wherein:
the plurality of second light emitting elements are coupled in parallel to each other between the third electrode and the fourth electrode to form a first serial set,
the plurality of first light emitting elements are coupled in parallel to each other between the first electrode and the second electrode to form a second serial set, and
the third electrode is an anode electrode and the first electrode is a cathode electrode.

16. The display device according to claim 13, wherein:
the pixel further comprises a bank comprising:
 a first open hole corresponding to the first emission area,
 a first open hole of the bank corresponding to the second emission area,
 a first open hole of the bank corresponding to the third emission area,
 a second open hole, and
 a third open hole spaced apart from the first open hole, and
the light blocking pattern is on the bank.

17. The display device according to claim 16, wherein:
the first open hole of the bank corresponding to the first emission area, the first open hole of the bank corresponding to the second emission area, and the first open hole of the bank corresponding to the third emission area have identical sizes.

18. The display device according to claim 17, wherein:
the light blocking pattern comprises a first opening corresponding to the first color filter pattern; a second opening corresponding to the second color filter pattern; and a third opening corresponding to the third color filter pattern, and
a size of the first opening is different from a size of the second opening and a size of the third opening.

19. The display device according to claim 18, wherein:
the size of the first opening is greater than the size of each of the second opening and the third opening, and
a size of the first color filter pattern is greater than a size of the second color filter pattern and a size of the third color filter pattern.

20. The display device according to claim 19, further comprising:
- a color conversion layer between the pixel and the color filter layer,
- wherein the color conversion layer comprises:
    - a first color conversion layer corresponding to the first color filter pattern to convert light emitted from the plurality of light emitting elements to a first color of light;
    - a second color conversion layer corresponding to the second color filter pattern to convert light emitted from the plurality of light emitting elements to a second color of light; and
    - a third color conversion layer corresponding to the third color filter pattern to convert light emitted from the plurality of light emitting elements to a third color of light or to transmit the emitted light without change.

* * * * *